(12) United States Patent
Rogers

(10) Patent No.: US 10,123,451 B2
(45) Date of Patent: Nov. 6, 2018

(54) DATA CENTRE

(71) Applicant: BRIPCO BVBA, Antwerp (BE)

(72) Inventor: Paul Rogers, Cheltenham (GB)

(73) Assignee: BRIPCO BVBA, Antwerp (BE)

( * ) Notice: Subject to any disclaimer, the term of this patent is extended or adjusted under 35 U.S.C. 154(b) by 51 days.

(21) Appl. No.: 15/093,252

(22) Filed: Apr. 7, 2016

(65) Prior Publication Data

US 2016/0302324 A1    Oct. 13, 2016

Related U.S. Application Data

(63) Continuation of application No. 14/236,987, filed as application No. PCT/GB2012/051894 on Aug. 3, 2012, now Pat. No. 9,347,233.

(30) Foreign Application Priority Data

Aug. 5, 2011    (GB) .................................. 1113556.3

(51) Int. Cl.
   *H05K 7/20*         (2006.01)
   *H05K 7/14*         (2006.01)
   (Continued)

(52) U.S. Cl.
   CPC ........... *H05K 7/1497* (2013.01); *E04B 1/343* (2013.01); *E04B 1/34315* (2013.01);
   (Continued)

(58) Field of Classification Search
   CPC .. H05K 7/1497; H05K 7/1489; H05K 7/1488; H05K 7/1491; H05K 7/1492;
   (Continued)

(56) References Cited

U.S. PATENT DOCUMENTS 3,563,882 A * 2/1971 Kimura et al. ...... H02G 3/0456
                                                174/72 R
3,832,811 A * 9/1974 Briel, Jr. ............ E04L 31/3445
                                                52/143
(Continued)

FOREIGN PATENT DOCUMENTS

DE            20314863 U1    3/2004
DE       202010011402 U1    10/2010
(Continued)

OTHER PUBLICATIONS

Partial European Search Report, Application No. EP 16182940, dated Apr. 5, 2017.
(Continued)

*Primary Examiner* — Joshua J Michener
*Assistant Examiner* — Kyle J. Walraed-Sullivan
(74) *Attorney, Agent, or Firm* — Stout, Uxa & Buyan LLP; Carlos A. Fisher

(57) ABSTRACT

A data center comprises a plurality of sections assembled together to define a unitary structure such that there exists at least one personnel area that spans at least two sections; wherein the sections comprise a first section with which there is associated a first service-carrying chassis and a second section with which there is associated a second service-carrying chassis, each of the first and second service-carrying chassis comprising a frame onto which is mounted components of at least two different services; the first and second chassis are connected to each other by means of a junction between the first and second chassis; and the first and second sections each include a ceiling and the first service carrying chassis is mounted on the ceiling of the first section and the second service carrying chassis is mounted on the ceiling of the second section.

11 Claims, 13 Drawing Sheets

(51) Int. Cl.
*E04B 1/343* (2006.01)
*E04H 1/00* (2006.01)
*E04H 1/12* (2006.01)
*E04B 1/348* (2006.01)
*E04H 5/00* (2006.01)

(52) U.S. Cl.
CPC ......... *E04B 1/34869* (2013.01); *E04H 1/005* (2013.01); *E04H 1/12* (2013.01); *E04H 5/00* (2013.01); *H05K 7/1489* (2013.01); *H05K 7/1492* (2013.01); *H05K 7/1495* (2013.01); *E04B 2001/34389* (2013.01); *E04H 2005/005* (2013.01)

(58) Field of Classification Search
CPC ............. H05K 7/20745; H05K 7/2079; H05K 7/1457; G06F 1/109; E04H 2005/005; E04B 1/343; E04B 1/34315; E04B 1/34869; H04H 1/12
See application file for complete search history.

(56) References Cited

U.S. PATENT DOCUMENTS

| | | | |
|---|---|---|---|
| 3,925,679 A | 12/1975 | Berman et al. | |
| 4,545,171 A * | 10/1985 | Colvin | E04L 31/3442 52/71 |
| 5,381,633 A * | 1/1995 | Hendrich | E04L 31/344 52/235 |
| 5,491,934 A | 2/1996 | Bigelow, Jr. et al. | |
| 5,628,157 A * | 5/1997 | Chen | E04F 15/02458 52/220.2 |
| 5,890,341 A * | 4/1999 | Bridges | B28B 7/0032 52/143 |
| 5,950,373 A * | 9/1999 | von Hoff | E02D 27/01 206/321 |
| 5,960,593 A * | 10/1999 | Murphy | E04L 31/3442 52/143 |
| 5,966,956 A | 10/1999 | Morris et al. | |
| 7,278,273 B1 | 10/2007 | Whitted et al. | |
| 7,293,666 B2 * | 11/2007 | Mattlin | G06F 1/181 211/189 |
| 7,315,448 B1 * | 1/2008 | Bash | H05K 7/2079 165/80.3 |
| 7,675,740 B2 * | 3/2010 | Rasmussen | G06F 1/189 174/50 |
| 7,738,251 B2 | 6/2010 | Clideras et al. | |
| 7,957,132 B2 * | 6/2011 | Fried | F28D 15/0266 165/185 |
| 8,469,782 B1 * | 6/2013 | Roy | H05K 7/20745 454/184 |
| 8,628,154 B2 * | 1/2014 | Caveney | H05K 7/20745 312/198 |
| 2003/0121689 A1 * | 7/2003 | Rasmussen | G06F 1/189 174/50 |
| 2004/0184232 A1 * | 9/2004 | Fink | E04H 5/02 361/690 |
| 2004/0194396 A1 * | 10/2004 | Shanni | E04L 31/3442 52/79.5 |
| 2004/0231875 A1 * | 11/2004 | Rasmussen | G06F 1/189 174/50 |
| 2005/0185363 A1 | 8/2005 | Rasmussen | |
| 2006/0082263 A1 * | 4/2006 | Rimler | B60P 3/14 312/201 |
| 2006/0277836 A1 | 12/2006 | Chazyn | |
| 2007/0274035 A1 * | 11/2007 | Fink | H05K 7/20 361/679.46 |
| 2007/0281639 A1 * | 12/2007 | Clidaras | G06F 1/20 455/128 |
| 2008/0060372 A1 | 3/2008 | Hillis et al. | |
| 2008/0060790 A1 | 3/2008 | Yates et al. | |
| 2008/0064317 A1 * | 3/2008 | Yates | B65D 88/745 454/118 |
| 2008/0094797 A1 * | 4/2008 | Coglitore | H05K 7/1497 361/679.5 |
| 2008/0291626 A1 | 11/2008 | Nelson et al. | |
| 2009/0198388 A1 | 8/2009 | Hillis | |
| 2009/0229194 A1 * | 9/2009 | Armillas | E04H 1/1205 52/79.1 |
| 2009/0301123 A1 | 12/2009 | Monk et al. | |
| 2010/0048119 A1 * | 2/2010 | Tashiro | H05K 7/20745 454/184 |
| 2010/0110626 A1 * | 5/2010 | Schmitt | H05K 7/1497 361/679.47 |
| 2010/0136895 A1 | 6/2010 | Sgro | |
| 2010/0165565 A1 * | 7/2010 | Hellriegal | G06F 1/183 361/679.46 |
| 2010/0188816 A1 | 7/2010 | Bean, Jr. et al. | |
| 2010/0192481 A1 * | 8/2010 | Shen | E04L 31/3444 52/79.5 |
| 2010/0223085 A1 | 9/2010 | Gauthier et al. | |
| 2010/0251629 A1 | 10/2010 | Clidaras et al. | |
| 2010/0277863 A1 | 11/2010 | Tozer et al. | |
| 2010/0290197 A1 | 11/2010 | Bergthold et al. | |
| 2010/0300650 A1 | 12/2010 | Bean, Jr. | |
| 2010/0307716 A1 | 12/2010 | Bean, Jr. et al. | |
| 2011/0063778 A1 * | 3/2011 | Brouillard | H05K 7/20645 361/678 |
| 2011/0083824 A1 * | 4/2011 | Rogers | H05K 7/20745 165/80.2 |
| 2011/0100668 A1 * | 5/2011 | Syed | G06F 1/18 174/50 |
| 2011/0240497 A1 * | 10/2011 | Dechene | E04H 5/02 206/320 |
| 2011/0271610 A1 * | 11/2011 | Cottuli | H05K 7/20745 52/173.1 |
| 2012/0155027 A1 * | 6/2012 | Broome | H05K 7/1497 361/696 |
| 2012/0181906 A1 * | 7/2012 | Caveney | H05K 7/20745 312/237 |
| 2012/0279141 A1 * | 11/2012 | Wiederick | E04H 5/02 52/79.5 |
| 2013/0155599 A1 * | 6/2013 | Ross | G06F 1/187 361/679.31 |
| 2014/0298734 A1 * | 10/2014 | Rogers | E04L 31/343 52/79.9 |

FOREIGN PATENT DOCUMENTS

| | | |
|---|---|---|
| EP | 2079000 A2 | 7/2009 |
| EP | 2101017 A2 | 9/2009 |
| EP | 2309833 A1 | 4/2011 |
| GB | 2467808 A | 8/2010 |
| GB | 5470448 A | 11/2010 |
| GB | 2474944 A | 5/2011 |
| SU | 77215 A1 | 10/1980 |
| SU | 773215 A1 | 10/1980 |
| WO | 2009132166 A2 | 10/2009 |
| WO | 2010039120 A1 | 4/2010 |
| WO | 2010056473 A2 | 5/2010 |
| WO | 2010139921 A1 | 12/2010 |
| WO | 2010144224 A1 | 12/2010 |
| WO | 2010148429 A1 | 12/2010 |
| WO | 2011051655 A2 | 5/2011 |

OTHER PUBLICATIONS

UKIPO Search Report on Priority Application GB 1113556.3 dated Dec. 6, 2011.
UKIPO Search Report on Priority Application GB 1113556.3 dated Jul. 9, 2012.
PCT International Search Report for PCT/GB2012/051894, dated Dec. 6, 2012.
PCT International Search Report on Patentability for PCT/GB2012/051894, dated Feb. 11, 2014.
Rackable's 'datacentre in a box' outcools Sun, TechWorld. Oct. 2, 2007.
Microsoft's data centers growing by the trucklaod, CNet, Aug. 20, 2008.

(56) References Cited

OTHER PUBLICATIONS

Mike Manos Microsoft' data center shipping magnate, Datecenter Dynamics, Nov. 30, 2008.
Our Vision for Generation 4 Modular Data Centers—One Way of getting it just right, Loosebolts, Dec. 2, 2008.
Rackable Systems: the Ice Cube, InetDaemon, Mar. 31, 2010.
Microsoft's next generation data center to include pre-assembled component based containers, Datacenter Dynamics, Mar. 3, 2010.
Microsoft's envisions ultra-modular data centers, ComputerWorld, Mar. 3, 2010.
Microsoft 'All In' on Container-Powered Cloud, Data Center Knowledge, Mar. 4, 2010.
Microsoft's Steve Ballmer at UW (Photos), University of Washington, Mar. 2, 2010.
SGI Embraces standarlized data center container, InfoWorld. May 26, 2010.
SGI extends line of continerlized data centers to fit standard-septh racks. Datecenter Dynamics, May 26, 2010.
A Modular, Scalable Date Centre with PUE of 1.13, The data Chain (website), Jun. 3, 2010.
HP's Cookie Cutter Data Center: Flexible DC, Information Week Network Computing, Jul. 27, 2010.
HP Flexible Data Center, Hewlett Packard, Jul. 27, 2010.
U.S. Office Action, dated Sep. 9, 2015.
U.S. Office Action, dated Jun. 29, 2015.
U.S. Office Action, dated Apr. 6, 2015.
U.S. Office Action, dated Dec. 15, 2014.

\* cited by examiner

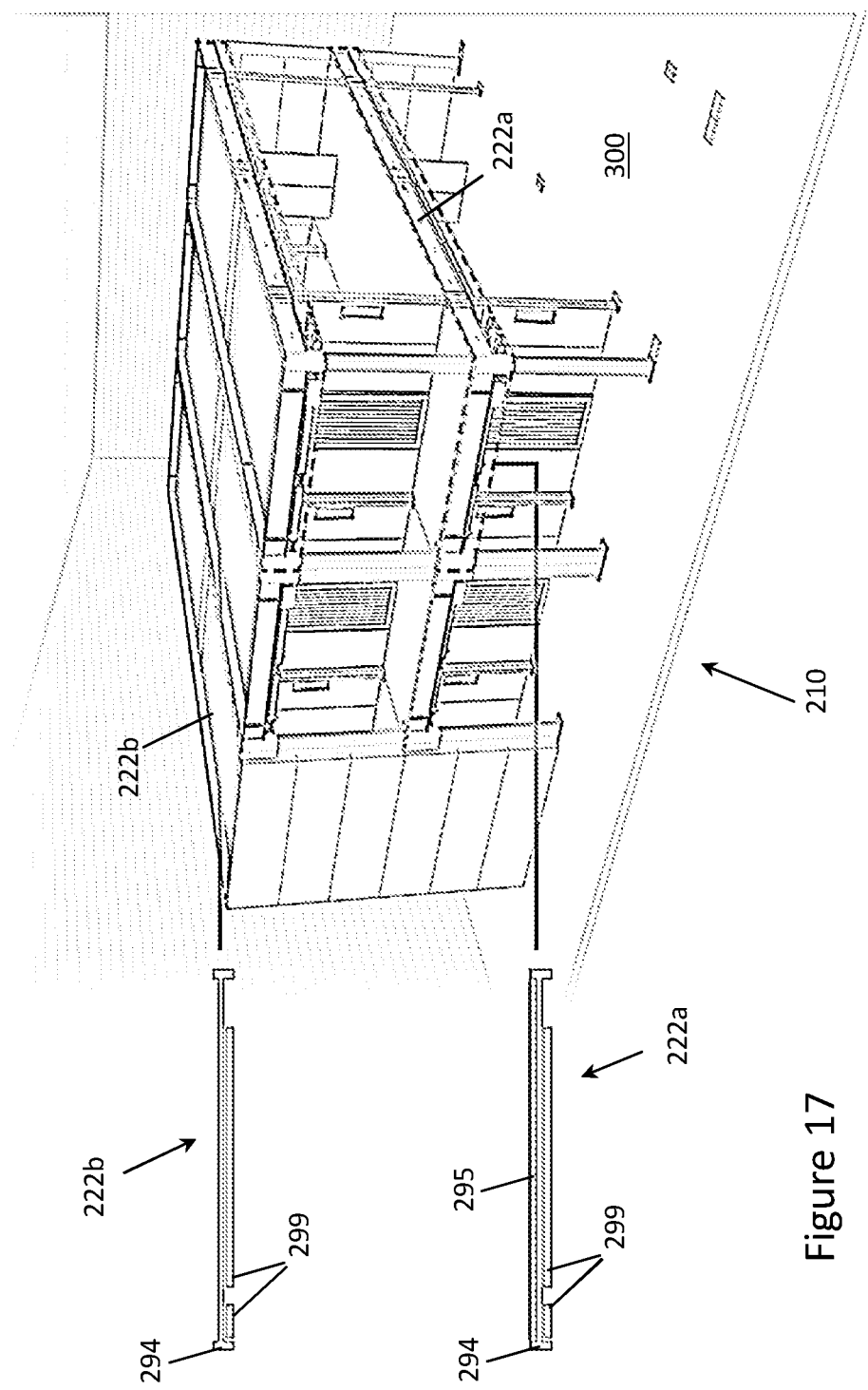

DATA CENTRE

FIELD OF THE INVENTION

The present invention concerns data centres and a method of constructing a data centre. More particularly, but not exclusively, this invention concerns data centre buildings, for example provided in sectional form. The invention also concerns a kit of parts for constructing a data centre.

BACKGROUND OF THE INVENTION

A data centre is a late 20th Century development that has grown as a response to the increasing demand for computer processing capability and a recognition of the importance of IT in the place of every business and organisation today. Whereas smaller organisations have sufficient processing power with laptops, PCs and occasionally servers, larger organisations require higher capacity centralised processing to serve a wide range of needs and applications. A few years ago this capacity was supplied by large mainframe computers, but more recently the method used has been to provide data centres comprising many networked computer servers known as blades installed in racks enabling controlled and modular expansion of capacity. The racks also typically house telecommunications equipment such as routers to handle data flow between the computer servers and data flow between the data centre and the outside world.

Data centres can mirror the growth and business activities of successful companies. The growth of a data centre within in an expanding company may typically work as follows:

1. Initially the data centre may start as single rack of servers in an air conditioned room—sometimes referred to as a 'data closet'.

2. As the organisation expands and along with it the number of IT racks employed, the closets become 'Server Rooms' or 'IT Rooms'.

3. Eventually the number of racks and size of room expands, often to the point where a dedicated building or part of a building houses the IT. Whilst there is no strict definition of when the size of an IT facility becomes large, or sophisticated, enough to be termed a "data centre", data centres are typically relatively large IT facilities providing robust and resilient IT facilities. Typically, there will be more than 50 servers (often many more) and at least some redundancy in the power supply powering the servers to ensure continuity of service.

4. As the company grows and/or becomes a multinational organisation additional data centres will be built and sometimes numbers of these will be consolidated into 'Super Data Centres'.

Data centre facilities can require a floor space ranging from a few hundred square feet to a million square feet. The most prevalent size for a small data centre is five to ten thousand square feet with fifty to a hundred thousand square feet being the most common floor area requirement for a large data centre.

Data centres will typically have the ability to deliver applications spread across an organisation and/or supply chain and/or customers in differing geographical locations. There will typically be a dedicated mechanical and electrical (M&E) plant to deliver power, cooling and fire suppression with built-in redundancy with the aim of providing near continuous operation.

The IT industry has long recognised the criticality of central computing facilities and the need for energy efficient operations to control cost effectiveness. Current data centre technology is the summation of 30 years of innovation and engineering design thought and has come a long way in recent times. The most advanced new data centre designs tend to fall into one of two different types, each of which has advantages and disadvantages. The first, more traditional, type of data centre is a huge, custom built warehouse style building which is often located so as to be able to take advantage of local weather conditions to aid cooling of the IT equipment it houses. These data centres can be spacious, ergonomic and highly energy efficient because the structure, layout and cooling systems of each data centre are designed from scratch around its particular location and intended use. Yahoo!'s "Computing Coop" data centre in New York is an example of this type of data centre.

The drawbacks of this type of data centre are the large cost and length of time for construction, which are necessary consequences of the bespoke design model. It is also not easy to add capacity—the data centre must be built large enough in the first place to cope with future increases in the number of servers required by its owner/occupier. These factors also make this style of data centre impractical for companies who need only a small or medium-sized data centre. A further significant drawback is the fact that only a few sites worldwide have a climate suitable for hosting such a large installation without placing undue demands on the cooling systems. The need for a large skilled construction workforce to be available at the site further limits the number of suitable locations.

The second type of data centre is the modular data centre, which is constructed from several factory-built modules. The modules are typically built and sometimes even fitted out at a central facility and then shipped to the location of the data centre, where they are connected together and to the local utilities. U.S. Pat. No. 7,738,251 (Google), for example, describes a modular data centre in which each module is formed by an ISO shipping container. This second type of data centre addresses some of the problems with the first type, but has several disadvantages of its own. In particular, it is necessary for easy transport of the modules that they conform to the dimensions of ISO shipping containers; however this significantly limits the space available inside each module for IT equipment, cooling systems and human access. If actual shipping containers are used as the basic modules, then this also places severe constraints on how the modules can be linked up into a single data centre. These features also mean that this style of data centre is generally not as energy efficient as the first type.

Some of the disadvantages of containerised data centres are overcome by the modular data centres described in WO 2010/139921 (Bripco) and WO 2011/051655 (Colt Technology Services). The data centres of WO 2010/139921 and WO 2011/051655 both consist of several modules which connect to form a building having internal spaces that span several modules. This allows for many more layout options than is possible with a containerised design.

The data centres of WO 2010/139921 and WO 2011/051655 still suffer from the disadvantage that, because the modules are assembled away from the site of the data centre, each module must be transported as a volumetric unit (where the volume of the unit when operational is the same as the volume of the unit when being transported). This necessarily involves significant costs due to the size of the modules, much of which volume comprises empty space inside the modules. This feature of prior art modular and/or containerised data centres places a limit on how energy efficient and cost-effective they can be, when the entire supply and construction process is taken into account.

The present invention seeks to mitigate the above-mentioned problems. Alternatively or additionally, the present invention seeks to provide an improved data centre and an improved method of constructing a data centre.

SUMMARY OF THE INVENTION

The present invention provides, according to a first aspect, a data centre comprising a plurality of sections assembled together to define a unitary structure such that there exists at least one personnel area that spans at least two sections; wherein the sections comprise a first section with which there is associated a first service-carrying chassis and a second section with which there is associated a second service-carrying chassis, each of the first and second service-carrying chassis comprising a frame onto which is mounted components of at least two different services; the first and second chassis are connected to each other by means of a junction between the first and second chassis; and the first and second sections each include a ceiling and the first service carrying chassis is mounted on the ceiling of the first section and the second service carrying chassis is mounted on the ceiling of the second section.

It will be appreciated that the personnel area may be any area within a data centre which it is possible for a person to enter, i.e. any room or corridor. For example the personnel area may be a rack room. The personnel area may be a cold aisle. The personnel area may be a cold corridor. Alternatively the personnel area may be a hot aisle. The personnel area may be a hot corridor. The data centre may comprise several such personnel areas.

The first and second sections each include a ceiling. The first service carrying chassis is mounted on the ceiling of the first section. The second service carrying chassis is mounted on the ceiling of the second section. Substantially all of the services in the first and second sections may be carried by the first and second service carrying chassis. There may be no services provided in the first and second sections other than the services carried by the first and second service carrying chassis. The services may include mechanical and electrical apparatus.

Thus, in an embodiment of the invention there may be no key mechanical and electrical apparatus (i.e. critical to the installation and operation of the data centre) mounted on the walls or floor of the majority of, if not all of, the data centre (e.g. such that no walls or floors are used in the data centre as supporting structure for the provision of trunk-like services to the areas in the data centre accommodating the IT racks). The advantages of mounting (substantially) all of the mechanical and electrical (M&E) apparatus in chassis on the ceiling in most areas of the data centre are several. Firstly, this allows the data centre structure to be broken down into a kit comprising a minimum number of component types, which in turn reduces the cost of constructing the data centre and allows it to be economically shipped to a site remote from where the kit is manufactured. Secondly, it means that the services, including the mechanical and electrical apparatus required by the data centre, can be fully installed and tested before the kit is assembled into a data centre, which makes assembly of the kit very quick and simple. Thirdly, the use of a single chassis to provide multiple services is a compact and efficient solution which speeds assembly on site, compared to prior art construction techniques in which installation of M&E services would be time-consuming. Further benefits and advantages will become apparent to the reader from the description that follows.

The services carried by the chassis may be in the form of utility-type services of the kind that require a conduit, for example, a pipe or cable or the like, to allow flow of fluids, power, signals, or the like from one location to another. The services may provide electrical power, data transfer and a fluid, for example.

The at least two different services may include at least one busbar. The at least two different services may include at least two busbars. One of these busbars may, but need not, be a backup busbar. The at least two different services may include at least one conduit for transporting fire suppressant gas. The at least two different services may include a cable tray. The at least two different services may include a length of network cable.

The at least two different services may include one or more connectors, for example for connecting adjacent sections of a busbar together. The junction between the two adjacent chassis may be formed by a plurality of separate connections. The junction may be formed by one or more separate junction connectors that link the services at one end of the chassis with the corresponding services at one end of the adjacent chassis. Preferably, there is provided a single junction connector for joining the services of adjacent chassis. The at least two different services may include a lighting system. It will be appreciated that in an embodiment of the invention in which the lighting system is substantially entirely mounted on the ceiling, having light switches mounted on the walls (as is common practice for data centres and indeed all buildings) is precluded. The lighting system may include one or more sensors for detecting when a first area of the data centre is occupied. The lighting system may be arranged such that the lights in the first area of the data centre are on when that area is occupied and are off when that area is not occupied. Advantageously, this arrangement removes the requirement for manually operated light switches and also improves the energy efficiency of the data centre.

The data centre may be arranged such that at least one of the ceilings includes at least one track for mounting a service carrying chassis on. The track may be in the form of a rail. At least one of the service carrying chassis may be mounted on the at least one track. At least one of the service carrying chassis may include at least one engagement member arranged to engage with the track. The at least one engagement member may be arranged to slidably engage with the track. Advantageously, in an embodiment of the invention in which at least one of the service carrying chassis slidably engages with the track, that service carrying chassis may be easily moved from one position on the track to another. At least one of the service carrying chassis and/or the track may include at least one sliding prevention member arranged to controllably prevent sliding between the track and the at least one service carrying chassis. The sliding prevention member may be a bolt. The sliding prevention member may be a clamp. At least one of the first and second service carrying chassis may be arranged so as to connect to at least one other service carrying chassis.

Each of the first and second service carrying chassis may comprise a frame, onto which is mounted at least one item of mechanical and electrical apparatus. The at least one item of mechanical and electrical apparatus may comprise a busbar section. The at least one item of mechanical and electrical apparatus may comprise a length of network cable. The at least one item of mechanical and electrical apparatus may comprise a cable tray. Alternatively or additionally the at least one item of mechanical and electrical apparatus may comprise a length of fire suppressant gas conduit.

If each of the first and second service carrying chassis comprises a frame, the frame may include engagement members for engaging with the track. The engagement members, if present, may slidably engage with the track.

Embodiments of the invention in which the services required for running the data centre are carried by one or more service carrying chassis benefit from the advantages that installing the services, including the mechanical and electrical apparatus, into the data centre is a simple task of arranging the chassis adjacent to each other and connecting them together. This requires little or no specialist expertise. The design of the chassis may be optimised so that they are simple to manufacture and convenient to transport, which allows the possibility of outsourcing the manufacture of the chassis whilst maintaining high quality standards. It also allows the possibility of forward manufacturing chassis and keeping them in stock for when they are required. Separating the manufacture of the services from the construction of the building structure in this manner also significantly compresses the manufacture and build time of the data centre. The data centre may include three or more chassis, connected in series, for carrying at least two different services. Each chassis may have a length of greater than 1 m. Each chassis may have a length of less than 10 m. Each chassis may have a width of greater than 0.1 m. may have a width of less than 2 m.

The data centre may be a modular data centre. The first and second sections may, but need not, be first and second modules of a modular data centre. It will be appreciated that the present invention is particularly advantageous when applied to embodiments in which the data centre is modular, since modular data centres are generally shipped from a manufacture location to a remote final assembly location. Usually each module is a pre-fabricated volumetric unit and must be transported as such; however the present invention allows the possibility of shipping each module as a compact kit of parts. Clearly this is highly advantageous with regards to the cost and energy efficiency of the modular data centre.

The volume of the kits of parts for a plurality of such modules when transported in such a compact manner may be significantly less (for example less than half) of the sum volume of the modules once assembled from such kits of parts. The invention also allows transportation of kits from a location remote from the intended site of the data centre to a local factory that is relatively near to the data centre site. The kits may be assembled into modules at the factory and then transported to the data centre site.

The modularity of the data centre is preferably provided by means of the data centre being divided into discrete sections that when assembled together form a unitary data centre structure. Thus, the various modules that form the data centre may perform different functions and need not be identically configured. There may for example be several IT room modules in the data centre. There may be a cooling air supply module for providing cooling air to the IT equipment in the data centre.

The sections may each comprise a wall. The sections may each define a volume. The volume may be greater than 10 m3 and is preferably greater than 20 m3. The volume may be less than 250 m3. It will be appreciated that the volume defined by each section need not be physically bounded on all sides. Thus two adjacent sections may each have a partially or fully open face on their adjacent sides; the division between adjacent sections would nonetheless still be clear as a result of connections, joins or abutting surfaces at the boundary between the adjacent sections. Such a feature provides considerably more design freedom since the components need not be assembled to make individual and self-contained modules, but can instead be used to construct something more akin to a custom-built data centre, for example with two or more modules defining a connected open space, with the consequent improvements to energy efficiency and working environment that this brings.

The data centre so constructed may be of a type that utilises a hot aisle/cold aisle configuration. There may be a plurality of hot aisles interleaved between a plurality of cold aisles. The data centre may utilise an above-floor cooling regime. The cooling regime may provide cooling air via a personnel corridor, as opposed to using dedicated cooling air ducts. The data centre may be housed within a larger building. The floor of the data centre (or the floor of the ground floor of the data centre if there is more than one storey to the data centre) may for example be formed by the floor of the large building.

The present invention also provides, according to a second aspect, a service carrying chassis for use in a data centre. The data centre may be one which comprises a plurality of sections, each with a ceiling, assembled together to define a unitary structure such that there exists at least one personnel area that spans at least two sections. The data centre may for example be a data centre according to the first aspect of the invention described herein. The service carrying chassis preferably comprises a frame, onto which is mounted components of at least two different services; and a mounting system for attaching the chassis to one of the ceilings of the data centre.

The components may include a busbar section. The components may include a plurality of busbar sections. The plurality of busbar sections may be arranged parallel to each other. The components may include a cable tray. The components may include a length of network cable. The components may include a light fitting.

The mounting system may comprise one or more engagement members arranged to engage with at least one of the ceilings. The engagement members may be arranged so as to be suitable for engaging with a track. The engagement members may be arranged so as to be suitable for slidably engaging with a track.

The present invention also provides, according to a third embodiment, a method of constructing a data centre comprising the steps of providing at least one ceiling portion; providing a plurality of supporting members; mounting services on the at least one ceiling portion; arranging the at least one ceiling portion and the plurality of supporting members into a first volume; transporting the ceiling portion and supporting members so arranged; and assembling the ceiling portion and supporting members to form a section of a data centre, the section so formed having a second volume; wherein the first volume is smaller than the second volume.

The first volume may be less than three-quarters of the second volume. Preferably the first volume is less than half of the second volume. The services may include at least two different services. The method may be performed such that the data centre is a modular data centre. If the data centre is a modular data centre, the first volume may be less than the volume of anyone of the modules of the data centre in assembled form. If the data centre is a modular data centre, the first volume may be less than half of the volume of any one of the modules of the data centre in assembled form. The step of mounting services on the at least one ceiling portion may include the step of providing a first service carrying chassis comprising first components of at least two different services. The step of mounting services on the at least one ceiling portion may include the step of attaching the first service carrying chassis to the at least one ceiling portion. The ceiling portion may comprise one or more ceiling portions. The method may additionally include the steps of providing at least one further ceiling portion; providing a second service carrying chassis comprising second components of at least two different services; attaching the second service carrying chassis to the at least one further ceiling portion; and connecting the first components to the second components. The method may be performed such that the second components are substantially identical to the first components.

The step of mounting services on the at least one ceiling portion may include the steps of providing at least one track on the ceiling portion; and slidably attaching the first service carrying chassis to the at least one track.

The at least one ceiling portion may be constructed from a plurality of corner elements and a plurality of horizontal support members. The horizontal support members are preferably joined to the corner elements to form a rectangular structure.

The plurality of supporting members preferably includes a plurality of vertical support members. The plurality of vertical support members may include a plurality of corner posts. The plurality of vertical support members may include intermediate posts. The vertical support members are preferably not joined to the ceiling portion during transportation. Preferably, the vertical support members are laid flat (and horizontal) during transportation. The corner elements have a height that is no more than 25% different from, and preferably substantially the same as, half the height of the first volume (of the parts when transported). Preferably the corner elements have a height of less than 1 m. Preferably the corner elements are arranged vertically when transported. Preferably the corner elements and the vertical support members are so arranged that in the assembled data centre, a vertical member extends vertically from each corner element. One of the corner element and the vertical support member includes a socket in which the other of the corner element and the vertical support member is received, in the assembled data centre. In the assembled data centre, the section of the data centre formed by the ceiling portion and the supporting members may form part of a roof of the data centre. The section of the data centre formed by the ceiling portion and the supporting members may form part of the floor of a second of higher storey of the data centre. Advantageously, the ceiling portion and the supporting members may be so configured that they may form, at the choice of the user/installer, part of a roof of a data centre or part of a floor of a second or higher storey of a data centre. The ceiling portion and the supporting members may thus be transported together with one or more roof portions. Having one set of components (e.g. ceiling portion and associated supporting members) that can be used selectively in each of (a) a single storey data centre, (b) as a lower level in a multi-storey data centre, or (c) as the uppermost level in a multi-storey data centre, allows for streamlining of manufacture and minimising the number of different components or systems required for multiple data centre builds.

It will be appreciated that the modules or sections of the data centre may be assembled before being joined to each other. Alternatively, part-assembled modules or sections of the data centre may be joined before each section or module is fully assembled. In either case, fit-out of the data centre will typically follow once the building of the data centre has been completed and the mechanical and electrical services installed. Installation of servers and networking IT equipment will typically be conducted when fitting-out, and/or possibly after (so that fit-out does not extend to putting servers in racks in the data centre building).

The method may be performed such that the first service carrying chassis is a service carrying chassis as described above.

Thus, in an embodiment of the invention the components of a data centre may be manufactured remotely from the site where the data centre is to be located, and furthermore, substantially all of the services (including the necessary mechanical and electrical apparatus) required for the operation of the data centre may be installed onto the ceiling portion and tested at this stage. There is no need to assemble the data centre components into a data centre in the factory, which clearly allows for a highly streamlined production line. The data centre components, with the services already fitted, can then be packaged into a volume small enough that several packages can be fitted into a standard ISO shipping container.

Clearly this has significant cost and environmental advantages as compared to shipping each data centre module in volumetric form, as is required by current modular data centre designs. The present invention also provides, according to a fourth aspect, a kit of parts for constructing a section of a data centre, the kit comprising at least one ceiling portion; a plurality of supporting members; and at least one service carrying chassis comprising components of at least two different services; wherein the at least one service carrying chassis is arranged to be mounted to the at least one ceiling portion.

The ceiling portion may be arranged to also function as a roof portion. The ceiling portion may be arranged to also function as a floor portion, for example if the kit is for constructing a section of a multi-storey data centre. The kit may additionally comprise at least one floor portion. The kit may be supplied such that the at least one service carrying chassis is mounted on the at least one ceiling portion at the time of supply. The at least one service carrying chassis may be integral with the at least one ceiling portion.

The kit may be arrangeable in a first configuration for facilitating transport of the kit and in a second configuration corresponding to the assembled configuration of the kit, wherein the volume of the first configuration is less than half the volume of the second configuration. The first configuration may have dimensions such that it fits inside an ISO shipping container. The first configuration may have dimensions such that at least two kits arranged in the first configuration fit inside a single ISO shipping container. Preferably the first configuration has dimensions such that at least three kits arranged in the first configuration fit inside a single ISO shipping container. The kit of parts may be arranged such that the data centre is a data centre as described above.

According to a further aspect of the invention, there is provided a data centre comprising a plurality of sections assembled together to define a unitary structure such that there exists at least one personnel area that spans at least two sections; wherein the sections comprise a first section with which there is associated a first service-carrying chassis and a second section with which there is associated a second service-carrying chassis;

the first and second chassis are connected to each other by means of a junction between the first and second chassis; and the first and second chassis each carry at least two different services.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which:

FIG. 16b shows an exploded perspective view of parts of the data centre shown in FIG. 16a; and FIG. 17 is a composite illustration showing on the right-hand side a perspective cut-away view of the two-storey data centre of the second embodiment and on the left hand side schematic representations of the construction of the ceiling of each storey.

DETAILED DESCRIPTION

Figure 1:
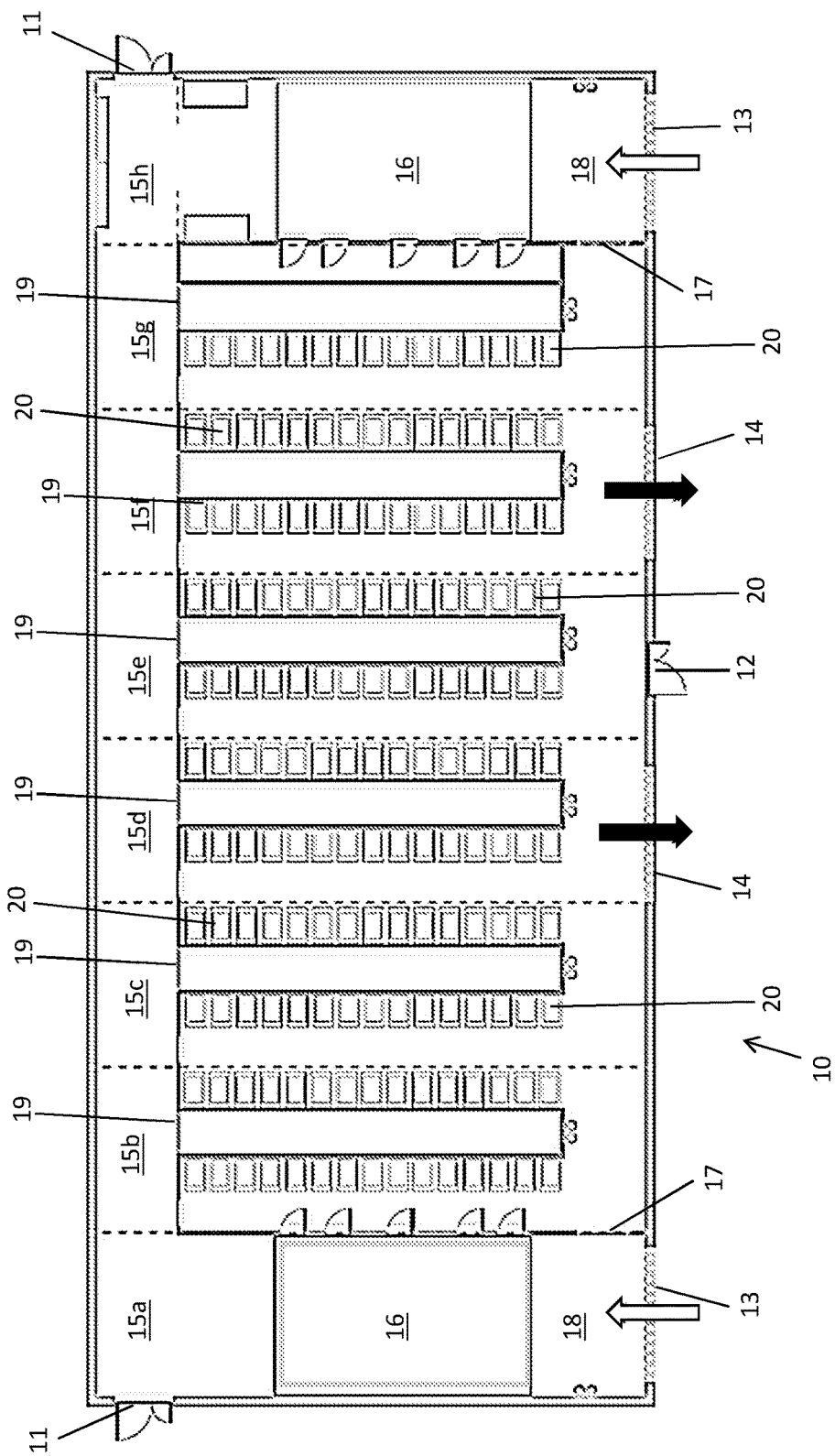
FIG. 1 shows a plan view of a data centre according to a first embodiment of the invention.

FIG. 1 shows the layout of a data centre building 10 according to a first embodiment of the invention. At either 15 end of the building 10 there is an entrance, 11. At the front of the building there is a fire exit 12. Also at the front of the building are two ambient air intake holes 13. Each ambient air intake 13 contains a set of controllable louvres which enable the amount of ambient air that is allowed into the building to be controlled. Ambient air entering the building is denoted by the white arrows.

Between the two ambient air intakes 13 there are two holes defining a pair of exhaust air outlets 14. Exhaust air outlets 14 also each contain a set of controllable louvres. Exhaust air exiting the building is denoted by the black arrows.

The data centre building is made up of eight sections 15a-h, with the joins between adjacent sections shown by dotted lines. The short ends of the rectangular sections form the front and back external side walls of the building. The left-hand side of section 15a and the right-hand side of section 15h form the left and right external side walls respectively of the building. All of the sections 15a-h have the same dimensions and basic construction, differing only in the provision and arrangement of internal and external doors and walls and air inlets and outlets.

Figure 2A:
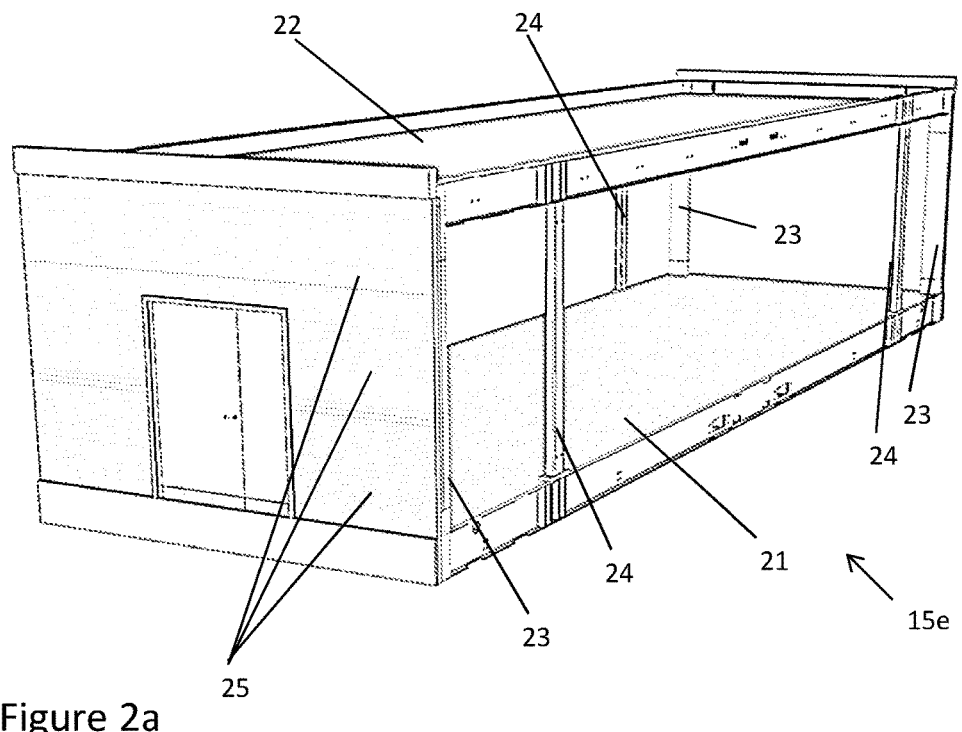
FIG. 2a shows a perspective view of a section of the data centre of FIG. 1.
Figure 2B:
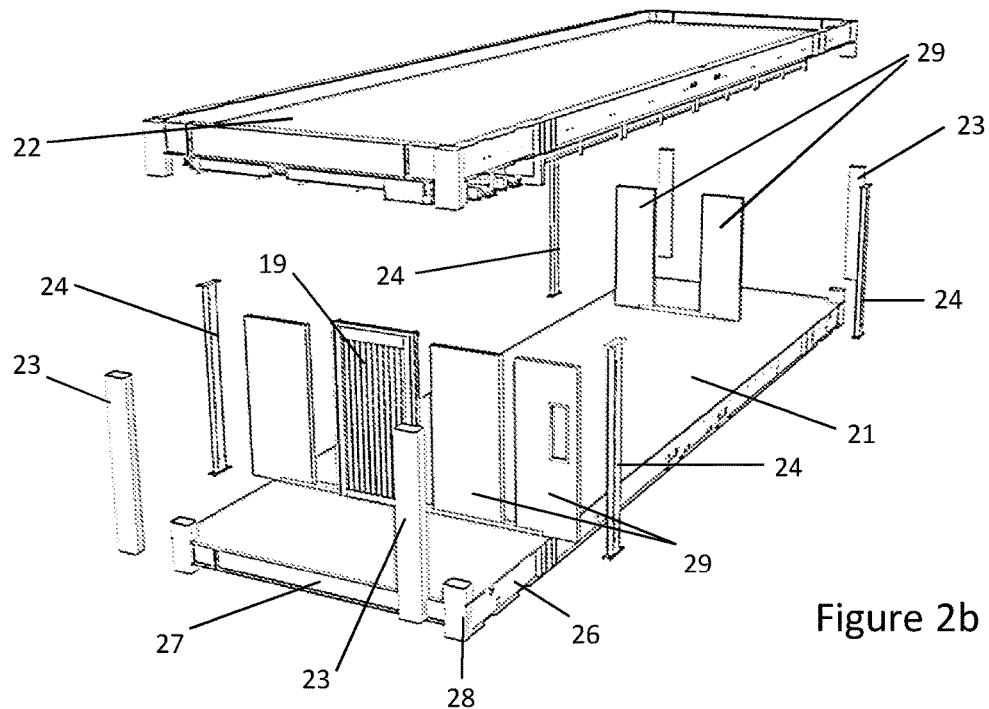
FIG. 2b shows an exploded view of the components of a section of the data centre of FIG. 1.

FIG. 2a shows section 15e (internal walls have been omitted for the sake of clarity) in isolation. FIG. 2b shows an exploded view of the components of section 15e with internal walls, but omitting external wall panels). All of the sections 15 consist of a floor portion 21, a ceiling portion 22, four corner support posts 23, four intermediate support posts 24, and six external wall panels (only the three front external wall panels are shown in FIG. 2a). Section 15e additionally includes a fire door in the front end wall, and sections 15d and 15f each additionally include an exhaust air outlet 14 in the front end wall. The external wall panels of these sections are shaped appropriately to accommodate these features. The external wall panels are formed from highly insulated aluminium panels, with a fire resistance of at least one hour.

Floor portion 21 and ceiling portion 22 are both based on a framework consisting of two long side steel beams 26, two short end steel beams 27, and four steel corner elements 28, which are designed to connect with the corner posts 23. The beams and corner elements are welded together in a rectangular shape. Steel joists (not visible) extending between the side beams are provided at regular intervals. The steel beams may, if desired, be provided with weakened sections which allow them to flex, so that the data centre building will be more resilient in the event of an earthquake.

Floor portion 21 additionally has a plywood floor deck supported on the joists, and a sheet of waterproof liner material fixed to the bottom of the joists. Ceiling portion 22 additionally has insulating material fixed above and below the joists, and a steel panel roofing system (such as Kingspan) including falls to both sides of the roof and external drainage collection, fixed over the top layer of insulating material. The lower surface (not visible) of the ceiling portion 22 is made from steel plate with a plastic coating finish.

Inside the section 15e there is an internal wall consisting of three internal wall panels 29 (one of which includes a glass viewing pane) and a vented door assembly 19. Two further internal wall panels 29 are also provided at the opposite end of section 15e. These serve to seal off the end of a cold aisle in the data centre. The internal and external wall and ceiling portions may, if desired, be constructed with magnetic shielding, RF or X-ray protection. The internal finish of the walls and ceiling is a plastic coated galvanised steel finish.

Data centre 10 comprises eight sections 15 arranged adjacent to each other and bolted together. Sections 15a and 15h, which will henceforth be referred to as air optimizer sections, each contain a region 16 which is designed to accommodate air treatment equipment such as adiabatic coolers, DX coolers, filters and fans. Sections 15a and 15h also each include an ambient air intake 13 through which ambient air can enter the data centre building 10, a controllable return air vent 17 through which warm air exhausted by IT equipment in the data centre can be returned to the air treatment equipment, and an air mixing box 18 for mixing the air from return air vent 17 and ambient air intake 13. Sections 15*a* and 1S*h* additionally each have an internal wall running along most of the length of one side of the section. These walls include the return air vents 17 and several doors which provide access to the air treatment equipment.

Sections 15*b-g*, which will henceforth be referred to as IT sections, are designed to accommodate IT equipment housed in standard server racks of up to 1200 mm depth. Each section 15*b-g* contains elongate rectangular rack storage areas (sections 15*b-f* each have two such rack storage areas whilst section 15*g* has just one, to allow for access to the adjacent air treatment region 16). Each rack storage area is effectively defined by a single row of racks 20 running lengthways along the section, i.e. widthways across the building.

In each section 15*b-g* at the rear end of the rack storage area(s) there is an internal wall running across the entire width of the section. A vented door 19 having controllable louvres is provided in the wall to allow personnel access and the passage of cooling air into the space between the racks, which is therefore a cold aisle. An additional, smaller internal wall is provided at the opposite end of the rack storage areas, spanning the gap between the racks. This internal wall is designed to close off the cold aisle at the front end. At the top of both rows of racks 20 are over-rack blanking plates (not shown) designed to stop cold air passing between the top of the racks 20 and the ceiling of the section. Hence, air can only leave the cold aisle through the racks 20.

When the sections are connected together a corridor running along and in between the rear external wall of the building and the rear internal walls is defined. This corridor runs along the entire length of the data centre building 10, terminating at each end in a wider area directly behind each air treatment region 16. The air treatment equipment supplies cooling air directly into this corridor at each end, hence it is a cold corridor. From this cold corridor, the cooling air passes through the vented doors 19 into the cold aisles.

The spaces that are defined between the rear sides of adjacent rows of racks when the sections 15*a-h* are connected together receive warm air exhausted by IT equipment in the racks, and are therefore hot aisles. The hot aisles are directly connected to a larger hot corridor which runs adjacent to the front external wall of the building, between the two return air vents 17. Hot air can exit the hot corridor through exhaust air outlets 14 and/or return air vents 17.

The data centre building 10 includes various services including lighting, smoke detection and fire suppression, power distribution, and controlling the air treatment equipment. As far as possible the mechanical and electrical apparatus is mounted on the ceiling of the data centre building 10. The arrangement of the mechanical and electrical apparatus in data centre building 10 will now be described with reference to FIGS. 3-7.

Figure 3:
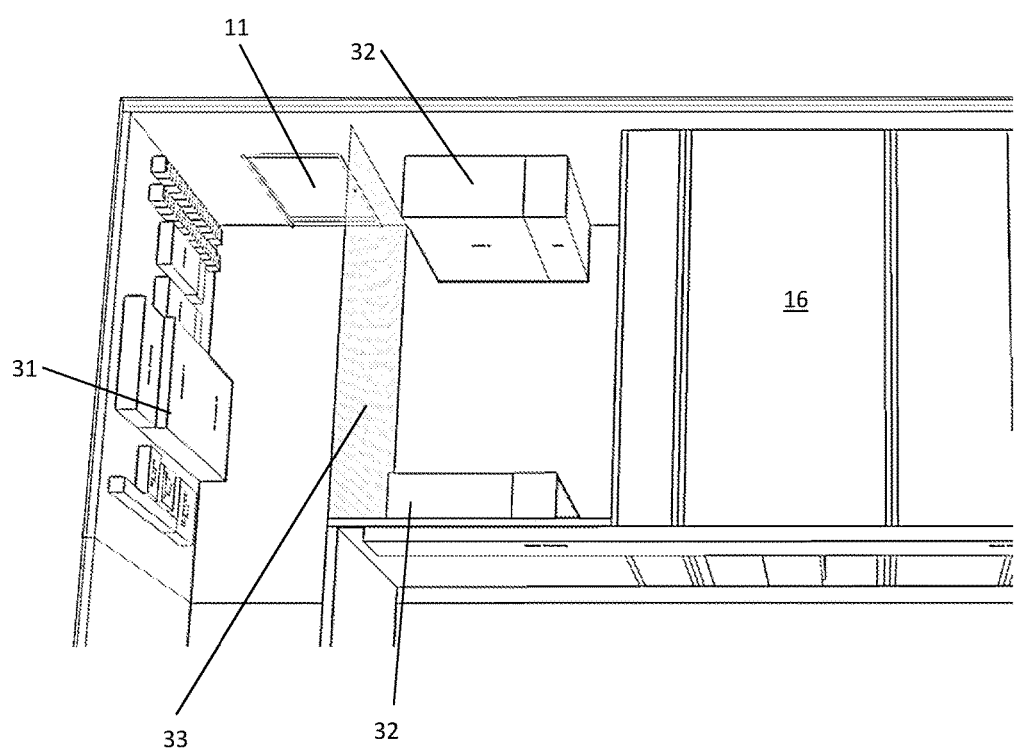
FIG. 3 shows a partial perspective view of the data centre of FIG. 1.

The space behind the air treatment region 16 in section 15*h*, which is shown in detail in FIG. 3, contains a power metering panel for monitoring the power consumed by each rack in the rack room module, two electrical distribution panels 32, a control process panel 31, a VESDA (Very Early Smoke Detection Apparatus) fire detection monitoring panel, and an uninterruptible power supply and back-up batteries. These apparatus are mounted on the walls of section 15*h*, which is the only section of the data centre building 10 to have any wall-mounted mechanical and electrical apparatus. A metal grille 33 separates the electrical distribution panels from the other panels. The grille 33 includes a portion that can be opened to allow personnel access to the electrical distribution panels 32.

Each of the IT sections 15*b-g* also has its own subcontrol panel, referred to as an outstation. The outstations 15 are located directly above the vented doors 19, and are integral with the door frames. Each outstation monitors and controls the position of the louvres in the vented door in its section, based on airflow velocity data for the cold aisle in its section. This data is provided by sensors located in ducts which link each cold aisle to an adjacent hot aisle.

The control process panel 31 receives data, such as temperature and humidity data, from various sensors inside and outside the data centre building 10. It also receives information about the positions of the louvres in the vented doors 19 from the outstations. It uses this information to control the air treatment equipment and the various controllable intake and outlet vents in order to achieve effective and energy efficient cooling of IT equipment in the racks.

The control process panel 31 communicates with the outstations, sensors, air treatment equipment and controllable vents using a wired network. Each outstation, sensor, item of cooling equipment and item of mechanical and electrical equipment which is monitored and/or controlled by the control process panel 31 must therefore be connected to it by a network cable. Network cables must also be connected to all of the IT equipment in the racks. Other services which must be distributed around the data centre building 10 include power, which is distributed using busbars, fire suppression gas, and lighting. In data centre 10 this is achieved by mounting all of these services to the ceiling using a system of service cassettes.

Figure 4:
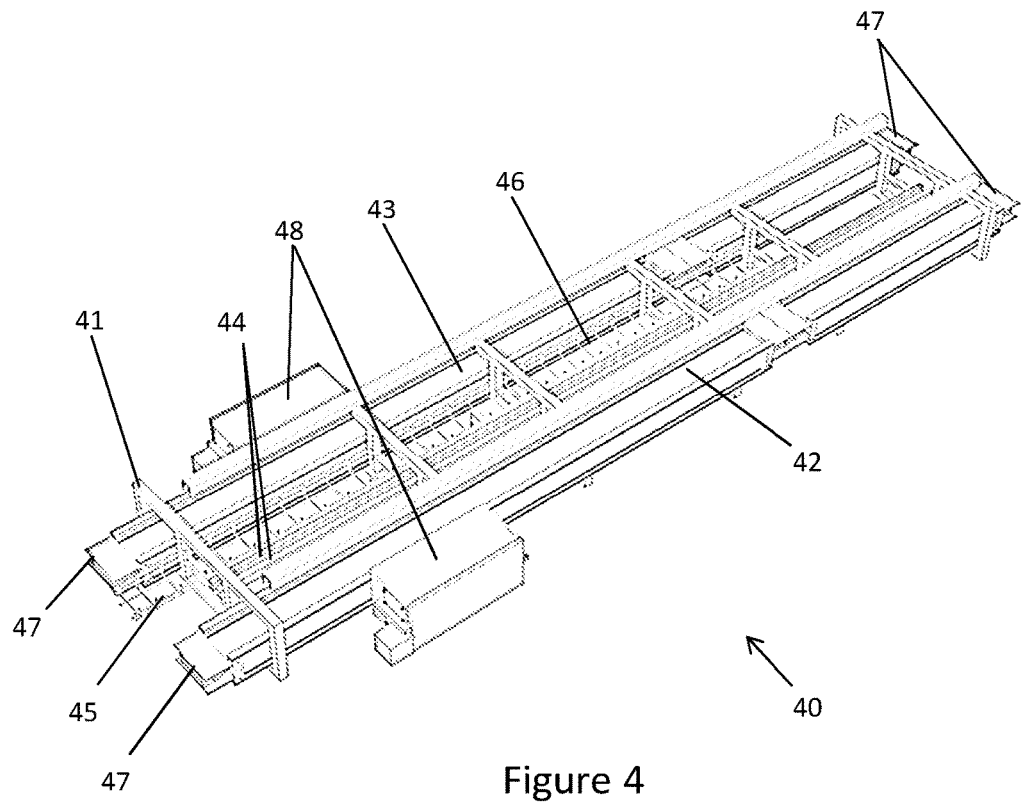
FIG. 4 shows a perspective view of a service carrying chassis according to the first embodiment.

FIG. 4 shows a cold corridor service cassette 40, for use in the cold corridor of data centre 10. The cassette 40 consists of a metal framework 41 which supports a length of main busbar 42, a length of back-up busbar 43, two lengths of UPS busbar 44 (which distributes power from the uninterruptible power supply), a cable tray 45, and a light fitting 46. A smoke sensor (not shown) is also attached to framework 41.

The busbar lengths 42, 43, 44 are provided with connectors 47 at each end so that they can be joined to adjacent busbar lengths on neighbouring service cassettes. The main and back-up bus bar lengths 42, 43 are also provided with junctions 48 which allow right-angled connections to be made with other busbars. The UPS busbar lengths have similar junctions (not shown) at a different point along their length. It will also be seen that the main busbar length 42 and the back-up busbar length 43 are each actually made up of two separate sections connected together. The light 46 is connected directly into the main busbar, and is wired to infrared sensors (not shown) attached to framework 41. The infrared sensors detect when the area immediately surrounding the light 46 is occupied and activate the light 46 only when this is the case. There is therefore no need for light switches to be provided on the walls.

The length of the cold corridor service cassette 40 is equal to the width of a section 15. One cassette 40 is mounted on the ceiling of each section 15 so that when the sections 15 are arranged adjacent each other, the busbar lengths in neighbouring service cassettes meet and can be connected together. Hence four busbars (main, back-up, small power UPS, and general lighting and power) are formed which run along nearly the entire length of the cold corridor, on the ceiling.

Figure 5:
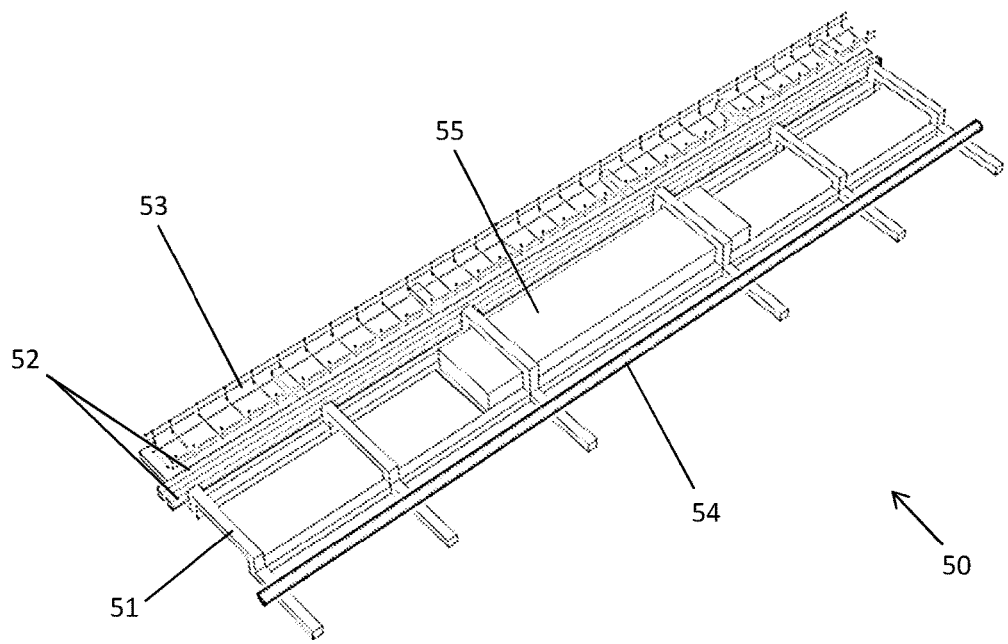
FIG. 5 shows a perspective view of a different service carrying chassis according to the first embodiment.

FIG. 5 shows a cold aisle service cassette 50, for use in the cold aisles of data centre building 10. Service cassette 50 consists of a metal framework 51 which supports the UPS and general busbar lengths 52, a cable tray 53, a length of fire suppression gas pipe 54, a light fitting 55 and its associated infrared sensors, and a smoke sensor (not shown). The UPS and general busbar lengths 52 are provided with connectors at each end. As with the light 46, light 55 is arranged to activate automatically when the area immediately surrounding the light is occupied.

The length of the cold aisle service cassette 50 is such that three cassettes 50 placed end-to-end are the same length as each of the cold aisles. Thus, when three cassettes 50 are mounted on the ceiling of a cold aisle and connected together they provide a small power UPS busbar, a general lighting and power busbar, and a fire suppression gas pipe which run the entire length of that cold aisle. The UPS busbar provides an uninterruptible power supply to the IT equipment in the racks facing onto that cold aisle.

Figure 6:
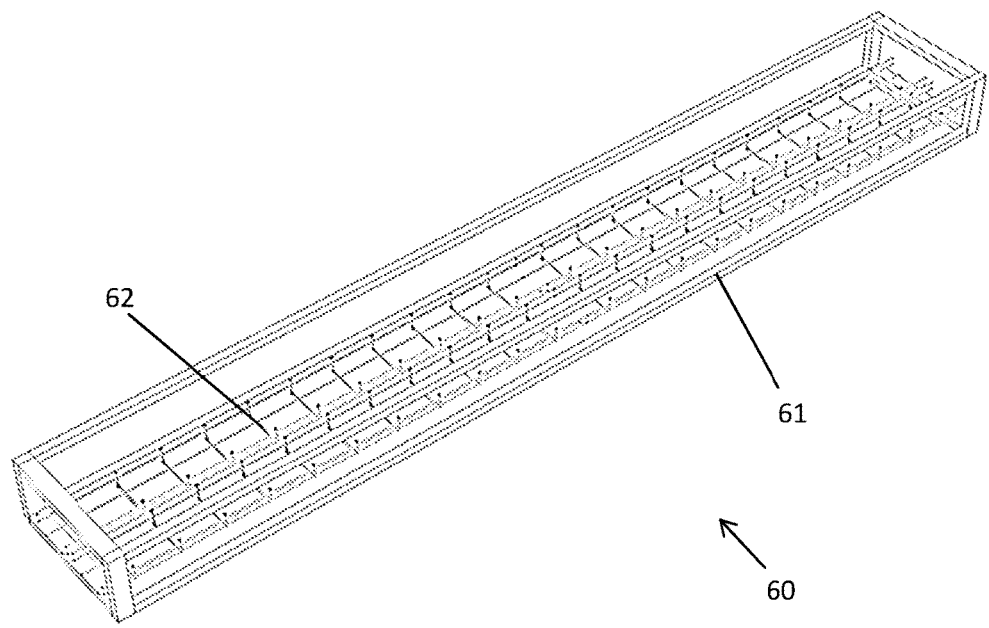
FIG. 6 shows a perspective view of a further different service carrying chassis according to the first embodiment.

FIG. 6 shows a hot corridor service cassette 60, for use in the hot corridor of data centre building 10. Most of the mechanical and electrical services are routed through the cold corridor, so cassette 60 simply consists of a metal framework 61 which supports a cable tray 62. A light fitting (not shown) and its associated sensor, and a smoke sensor (not shown) are also fixed to the framework 61. The length of the hot corridor service cassette 60 is equal to the width of a section 15. One cassette 60 is mounted on the ceiling of each section 15 so that when the sections 15 are arranged adjacent each other, cable trays and lighting are provided along the entire length of the hot corridor.

Figure 7:
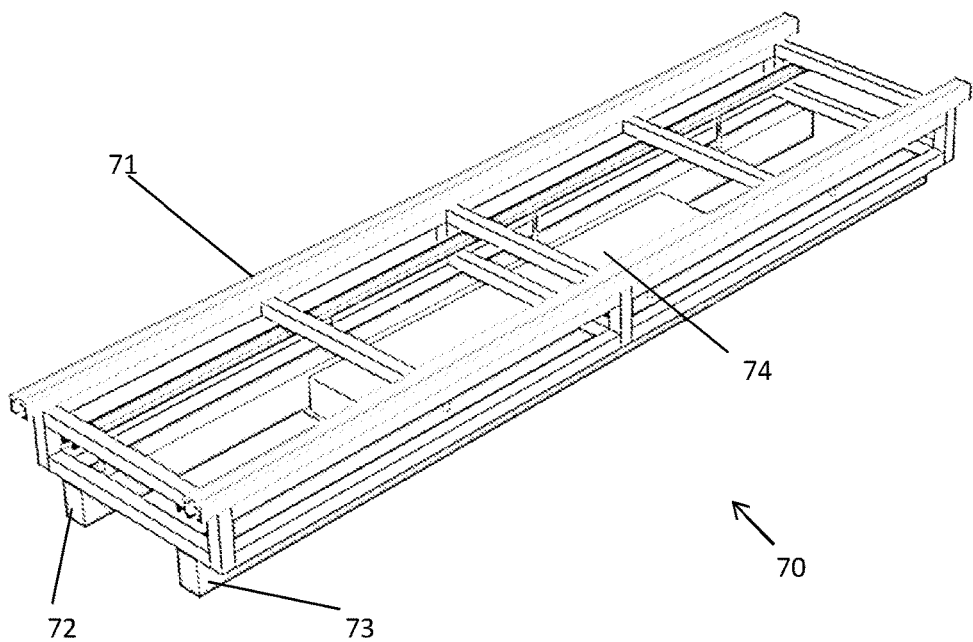
FIG. 7 shows a perspective view of yet another different service carrying chassis according to the first embodiment.

FIG. 7 shows a hot aisle service cassette 70, for use in the hot aisles of data centre building 10. Cassette 70 consists of a metal framework 71 which supports a length of main busbar 72, a length of back-up busbar 73, and a light fitting 74. Infrared sensors (for operating the light) and a smoke sensor are also fixed to framework 71. The busbar lengths 72 and 73 are provided with connectors at each end. The length of the hot aisle service cassette 70 is such that three cassettes 70 placed end-to-end are the same length as the hot aisles. Thus, when three cassettes 70 are mounted on the ceiling of a hot aisle and connected together they provide a main busbar and a back-up busbar which run the entire length of that hot aisle. These busbars provide the main power supply for the IT equipment in the racks backing onto that hot aisle.

The service cassettes 40, 50, 60 and 70 are mounted to the ceiling via rails attached to the ceiling portions. The cassettes 40, 50, 60 and 70 have gripping members (not shown) which fit around the rails. These gripping members secure the service cassettes to the ceiling whilst also permitting sliding movement along the rails, which facilitates the task of connecting adjacent cassettes. Each gripping member includes a bolt which, when the service cassette is in the desired place, can be screwed in so as to press against the rail. When screwed in the bolts prevent the service cassette from sliding.

Adjacent cassettes of the same type are connected end to-end as described above. However, busbars carried by the hot aisle service cassettes 70 and the cold aisle service cassettes 50 must also be connected to the busbars carried by the cold corridor service cassettes 40. For the cold aisles this is achieved by connecting the ups busbars in the cold corridor to each of the outstations using the junctions provided on the UPS and general busbars. The UPS and general busbars in each of the cold aisles are then also connected to their respective outstations by the connectors at the end of the busbar lengths.

The main and back-up busbars in the hot aisles are connected directly to the main and back-up busbars in the cold corridor at junctions 48, by way of additional lengths of busbar which pass through slots in the internal wall between the cold corridor and each of the hot aisles. These additional lengths of busbar connect at one end to connectors on the hot aisle service cassettes 70 and at the other end to the junctions 48. The slots in the internal wall are arranged to seal around the busbars (and any cables) which pass through them so as to prevent air passing between the cold corridor and the hot aisles.

The fire suppression gas pipes carried by the cold aisle service cassettes 50 are sealed at the ends which terminate at the internal wall separating the cold aisles from the cold corridor. At their opposite ends, each of the pipes passes through a hole in the internal wall between the cold aisle and the hot corridor. These holes are sealed around the pipes so as to prevent air passing from the cold aisle to the hot corridor. In the hot corridor each gas pipe runs vertically down the internal wall to connect with a pair of cylinders in which fire suppression gas is stored.

The method by which a data centre building 10 is constructed will now be described with reference to FIGS. 8-15.

The air treatment sections 15a and 15h are composed of the set of components listed in table 1a. The IT sections 15b-g are composed of the set of components listed in table 1b. These components may all be manufactured in a central factory, alternatively the manufacture of some of the components may be outsourced to specialist manufacturers to reduce costs and build time. If the data centre building is to be located in a different country from the central factory, or even a considerable distance away in the same country, it is advantageous to source these components from a manufacturer local to the data centre site. In the case of the floor and roof coverings a particular local supplier is nominated to ensure high levels of consistency and quality.

TABLE 1

Components of an air optimiser section

| Section | Component | Source |
| --- | --- | --- |
| Air optimizer section(15a and 15h) | Building management system controls | Central factory |
|  | Power metering apparatus | Central factory |
|  | Fans | Central factory |
|  | Humidifier and humidifier control | Central factory |
|  | DX cooling controls and expansion | Central factory |
|  | Trim Packs | Central factory |
|  | Sensors | Central factory |
|  | Louvre actuators | Central factory |
|  | Building Management System | Central factory |
|  | Fire alarm and fire suppression systems | Central factory |
|  | Floor portion | Locally Sourced |
|  | Ceiling portion | Locally Sourced |
|  | Corner and intermediate posts | Locally Sourced |
|  | External wall panels | Locally Sourced |
|  | Internal Wall panels | Locally Sourced |
|  | Internal and | Locally Sourced |

TABLE 1-continued

Components of an air optimiser section

| Section | Component | Source |
|---|---|---|
| | external doors | |
| | Air intake and return air vent louvres | Locally Sourced |
| | Coldlocks and easipaths | Locally Sourced |
| | Transit covers/ lifting eyes/locating plates | Locally Sourced |
| | Fixings | Locally Sourced |
| | Air Optimiser chassis | Locally Sourced |
| | Low Voltage electrical panels | Locally Sourced |
| | Service cassettes | Locally Sourced |
| | Cabling | Locally Sourced |
| | DX units | Locally Sourced |
| | Floor Covering | Locally Sourced |
| | Roof Covering | Locally Sourced |

The components which are marshaled in the central factory include the controls for the building management system and for the DX cooling units, all of the power metering apparatus for the data centre building, the humidifiers and their associated controls, the various sensors used to control the data centre, and trim packs, which include the external cladding and fascias, internal skirting and ceiling trims, and trims for the doors and louvre frames. These components are packaged up and transported to a local assembly facility relatively near the site where the data centre is to be located.

TABLE 2

Components of an IT section

| | | |
|---|---|---|
| IT SECTION (15b-g) | Outstation | Central factory |
| | IT room network switches | Central factory |
| | Vented doors and actuators | Central factory |
| | Power metering apparatus | Central factory |
| | Trim packs | Central factory |
| | Floor portion | Locally sourced |
| | Ceiling portion | Locally sourced |
| | Corner and intermediate posts | Locally sourced |
| | External wall Panels | Locally sourced |
| | Internal wall panels | Locally sourced |
| | Internal and external wall doors | Locally sourced |
| | Blanking panels | Locally sourced |
| | Exhaust air outlet louvres | Locally sourced |
| | Coldlocks and easipaths | Locally sourced |
| | Transit covers/lifting eyes/locating Plates | Locally sourced |
| | Fixings | Locally sourced |
| | Service cassettes | Locally sourced |
| | Cabling | Locally sourced |
| | Fire alarm and fire suppression systems | Locally sourced |
| | Floor covering | Locally sourced |
| | Roof covering | Locally sourced |

Locally sourced components, which include the components making up the structural frame of the sections, are delivered to the local assembly facility from the local manufacturer from which they have been commissioned.

Figure 8:
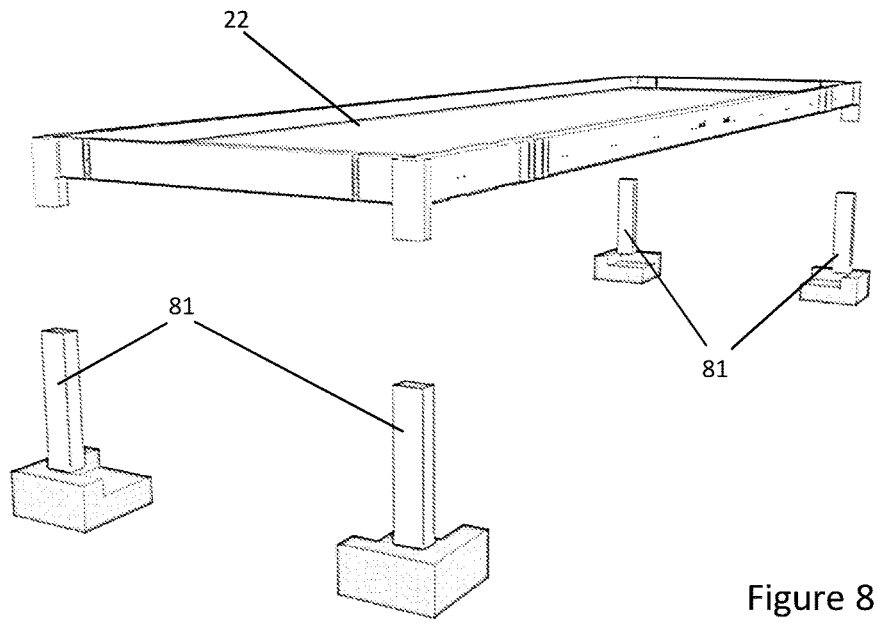
FIG. 8 shows a perspective view from above of a ceiling portion and supports according to the first embodiment.
Figure 9:
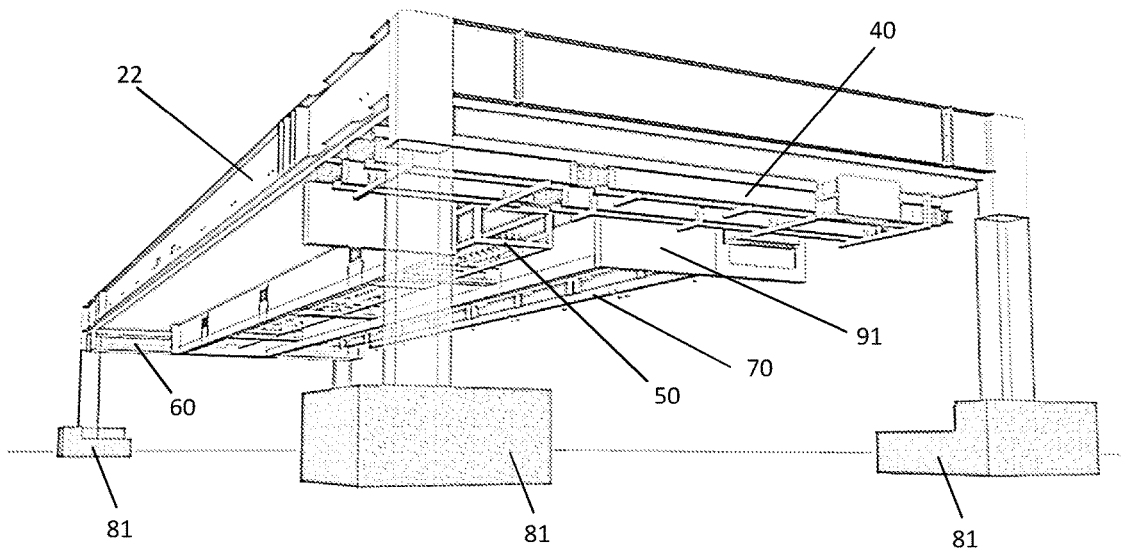
FIG. 9 shows a perspective view from below of a ceiling portion, service carrying chassis and supports according to the first embodiment.

At the local assembly facility, the roof and floor coverings are installed on the ceiling portions 22 and the floor portions 21. Then the service cassettes carrying most of the mechanical and electrical apparatus required in the data centre building 10 are fitted to the ceiling portions 10 22 for the IT sections 15*b-g*. To allow easy fitting of service cassettes to a ceiling portion 22, in the local assembly facility the ceiling portion is supported on columns 81 which are just tall enough to allow a person to stand underneath the ceiling portion, as shown in FIGS. 8 15 and 9.

As a first step, rails are fitted to the underside of the ceiling portion 22, along the width of the portion in the regions that will form parts of the ceilings of the hot corridor and the cold corridor, and along its length in the regions that will form the ceilings of the hot aisle and the cold aisle. A cold corridor service cassette 40 is then engaged with the rails on the cold corridor ceiling region and slid into place so that the ends of the service cassette 40 line up with the long edges of the ceiling portion 22. When in place the bolts on the gripping members are screwed in to prevent further movement of the cassette 40.

Three hot aisle service cassettes 70 are engaged (in series) with the rails on the hot aisle ceiling and slid into position. Connections are made between the busbar lengths 72 and 73 carried by the service cassettes 70 and the bolts on the gripping members are screwed in to secure the service cassettes 70 in position. This process is repeated for the three cold aisle service cassettes 50 and the hot corridor service cassette 60.

Bulkheads 91 which fill the space between the top of the racks 20 and the ceiling are also fixed to the ceiling portion 22 at this point. The ceiling portion 22 is then ready to be packed up with rest of the structural components of the IT section.

Figure 10:
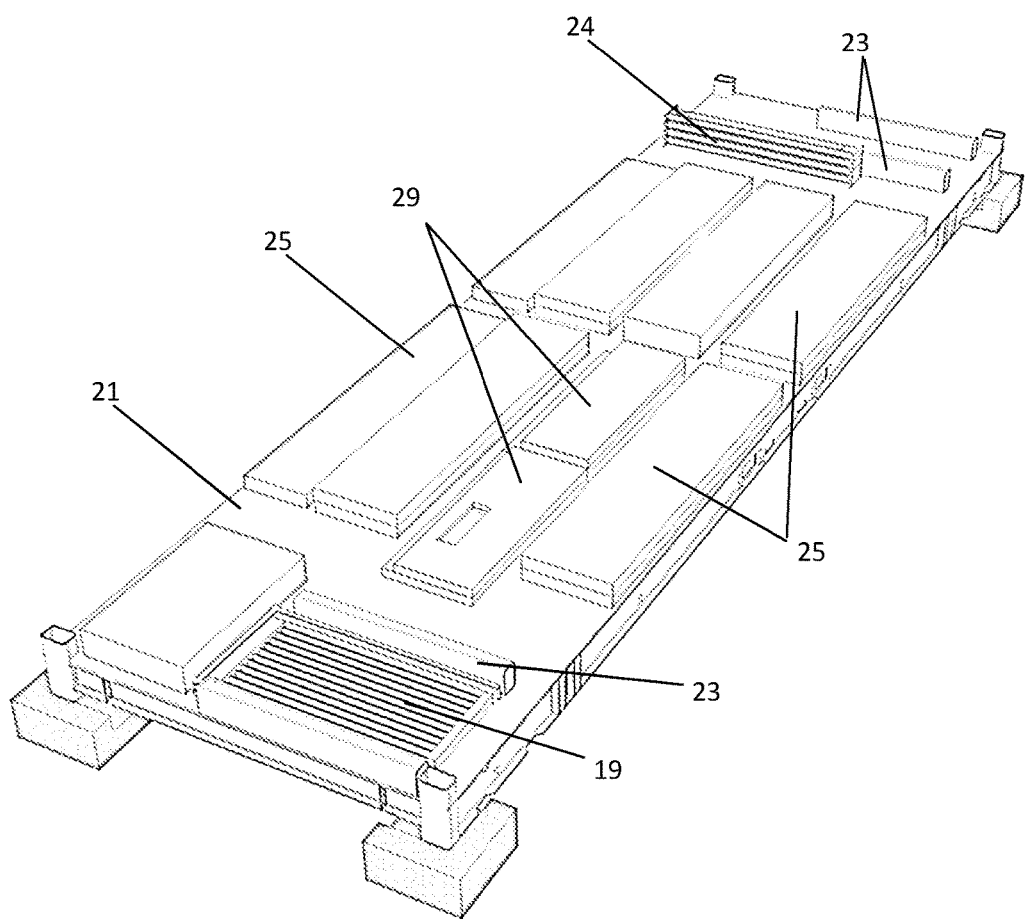
FIG. 10 shows a perspective view of a floor portion and other components of a data centre section according to the first embodiment.
Figure 11:
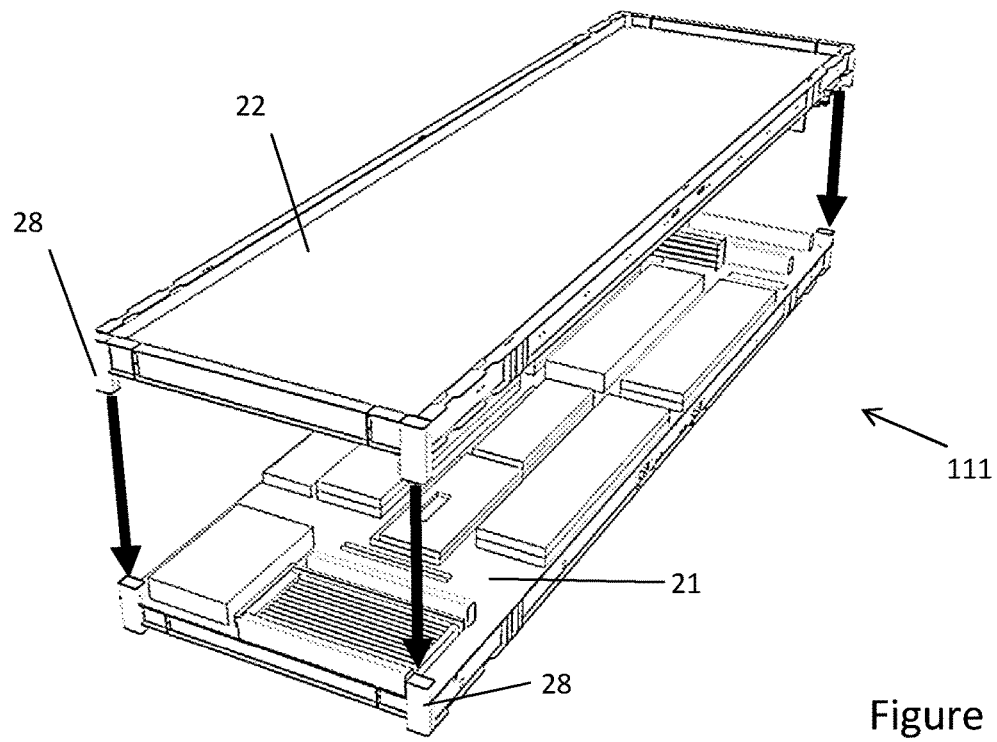
FIG. 11 shows a perspective view of components of a data centre section according to the first embodiment.

All of the structural components of the IT section can be arranged into a compact space for transit by arranging them as follows. The external wall panels 25, vented door assembly 19, corner posts 23, intermediate posts 24 and internal wall panels 29 are laid out flat on top of floor portion 21 as shown in FIG. 10, and temporarily fixed into place using any suitable removable securing means known in the art. The ceiling portion 22, with attached service cassettes and bulkheads is then placed on top of these components as shown in FIG. 11 to form a package 111.

The corner elements 28 are formed such that the corner elements of the ceiling portion 22 have a wide section and a narrow section, with a lip where these two sections meet. The narrow section can be inserted into the corresponding corner element on the floor portion 21. The lip then rests on the top of the floor portion corner element and supports the weight of the ceiling portion 22. The height of the corner elements 28 is such that when the floor and ceiling portions are fitted together in this manner there is a small gap between the bottom of the service cassettes and the components laid out on top of the floor portion 21. Thus the ceiling portion 22 covers and protects the components laid out on the floor portion 21 but does not bear any weight onto them. The corner elements 28 of the floor and ceiling portions are then bolted together to allow the entire package 111 to be handled as a single unit.

Figure 12:
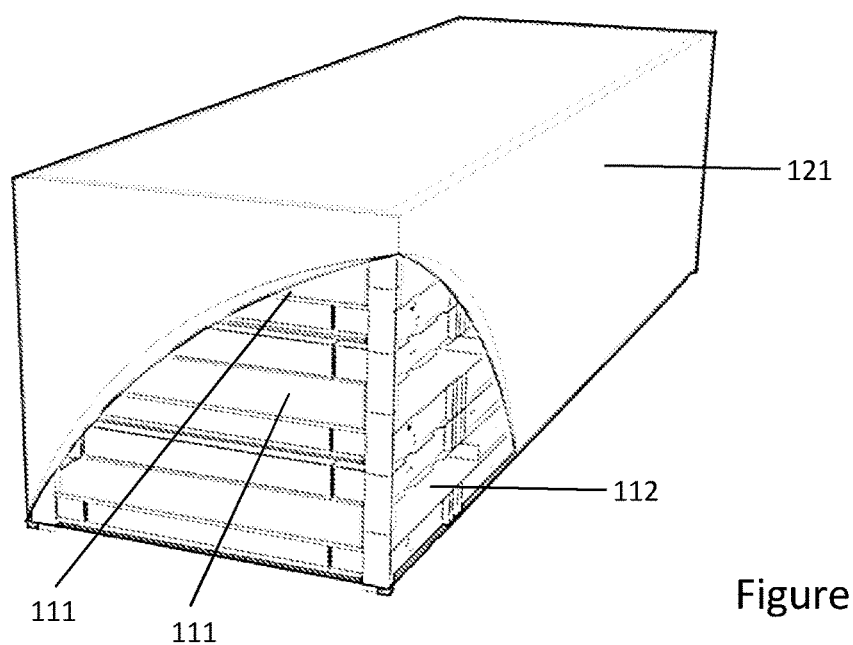
FIG. 12 shows a perspective view of packaged components of three data centre sections according to the first embodiment.

The process of assembling and packing the components of the air optimisation sections 15*a* and 15*h* is very similar to that described above for the IT sections 15*b-g*, however service cassettes are not used in these sections. The packing process for an air optimisation section therefore involves just arranging and securing the components of the air optimisation section between the floor and ceiling portions 21 and 22 and fixing the floor and ceiling portions together to form a package 112. Because the floor and ceiling portions of the air optimisation sections are identical to the floor and ceiling portions of the IT sections, the packages 111 and 112 are of identical shape and size. Three such packages stacked one on top of the other, as shown in FIG. 12, will fit into a standard ISO shipping container. A cover 121 protects the floor and ceiling portions 21, 22 from incurring cosmetic damage during transit.

Figure 13A:
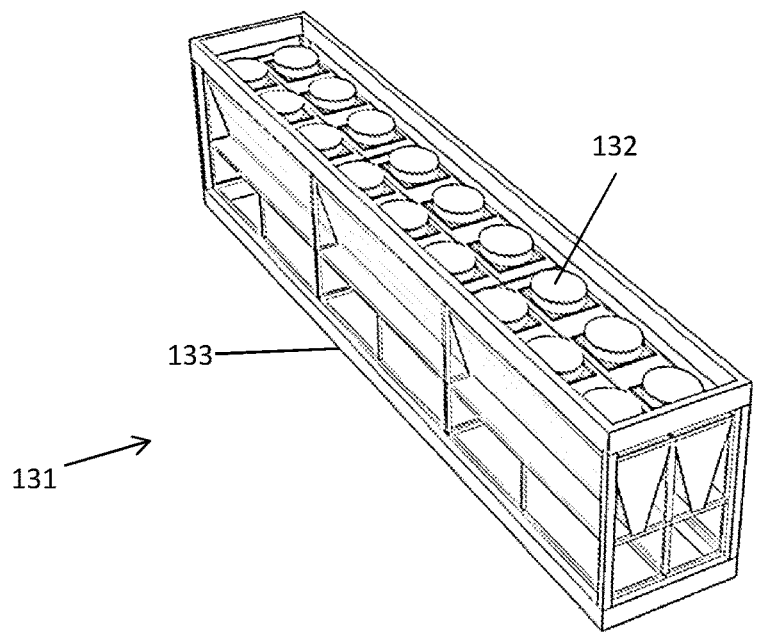
FIGS. 13a and b show perspective views of a DX module and an air optimiser module respectively according to the first embodiment.

The remaining components of the data centre which are not packed up with the IT sections and air optimizer sections are packaged up separately. In particular, the DX units are packaged into self-contained DX modules 131. A DX module 131 is shown by FIG. 13a. In each DX module 131 the DX units 132 are secured into a stackable metal frame 133 which is designed to fit within a standard ISO shipping container. All of the DX condensers 132 in a DX module 131 are connected up to power and control cabling and refrigerant gas pipework which meets at a single connection point (not visible). The DX modules 131 can be installed onto the data centre building 10 in this form, and only require connection to the appropriate utilities (i.e. power, a supply of refrigerant gas, and the process control panel 31) before being ready for use.

Figure 13B:
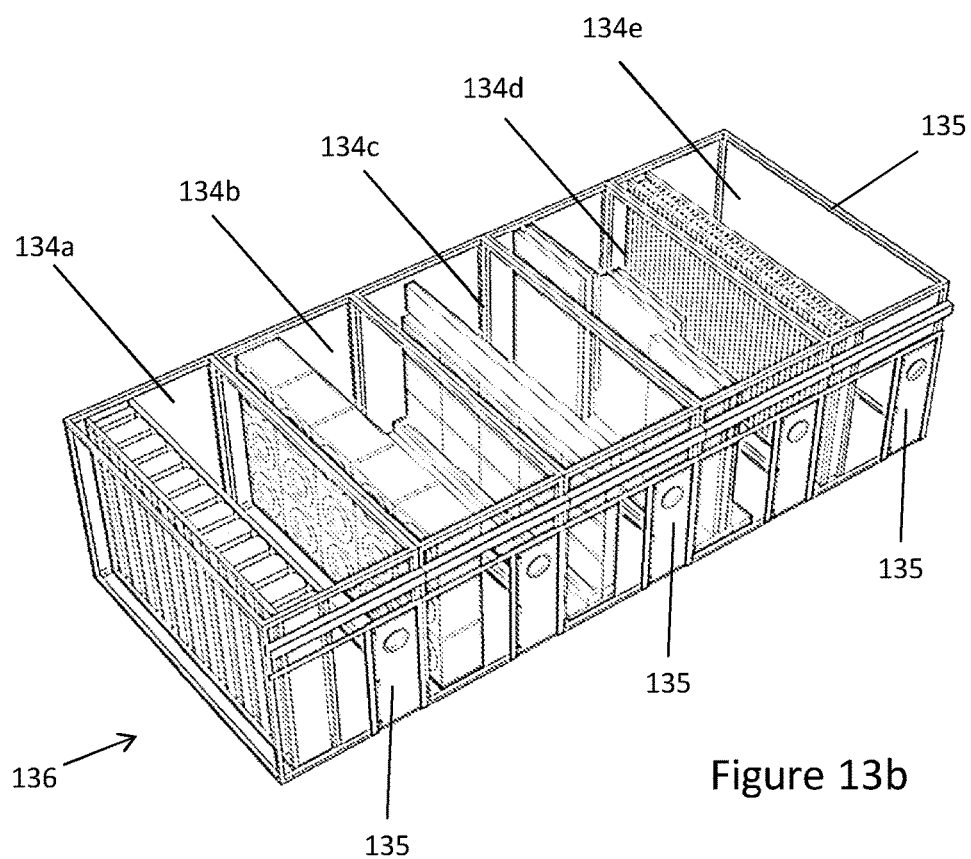

The other items of air treatment apparatus required by the data centre are also provided packaged in stackable metal frames 135 with single connection points, as shown by FIG. 13b. Five such frames carryall of the air treatment equipment required by a single air optimisation section 15a, 15h. Frame 134a carries sound attenuators. Frame 134b carries a bank of variable speed fans. Frame 134c carries humidifiers. Frame 134d carries the DX cooling coils.

Finally, Frame 134e carries air filters. Each frame 134a-e also carries a door 135 to allow access to the air treatment equipment. The frames 134a-e can be connected together to form an air optimisation module 136 which can then be inserted into an air optimisation region 16 in one of the air optimisation sections 15a, 15h.

Once packed up, all of the components of the data centre building 10 are transported to the site where the data centre is to be located. This site must be provided with a flat, level foundation and connections to supplies of electricity and water, drainage facilities, and a communications network.

Erecting the data centre building 10 from its constituent components requires no skills beyond what a typical construction worker would possess, and as such it is possible to use a construction team hired locally to the data centre site. The process of erecting the data centre building 10 will now be described with reference to FIGS. 14 and 15.

The first step in the erection of the data centre building 10 is to separate the section packages 111, 112 and remove the components which are secured to the floor portions 21. Each section 15 is then erected as follows. The corner posts 23 and intermediate posts 24 are connected to the floor portion 21 and bolted in place. The ceiling portion 22 is then lifted onto the corner and intermediate posts. The corner elements 28 of ceiling portion 22 and the corner posts 23 are shaped such that the top portion of each corner post 23 receives within it the narrow part of the corresponding corner element 28. The corner elements of the floor portion 21 and the bottom portion of each corner post are similarly complementarily shaped, however the bottom portion of each corner post is received within the corresponding floor portion corner element. The top and bottom ends of the intermediate posts 24 are received into recesses in the ceiling portion 22 and floor portion 21 respectively. This ensures that the structure formed by the floor portion 21, corner posts and ceiling portion 22 remains securely in place until all of the corner elements 28 can be bolted to the corner posts 23.

Figure 14:
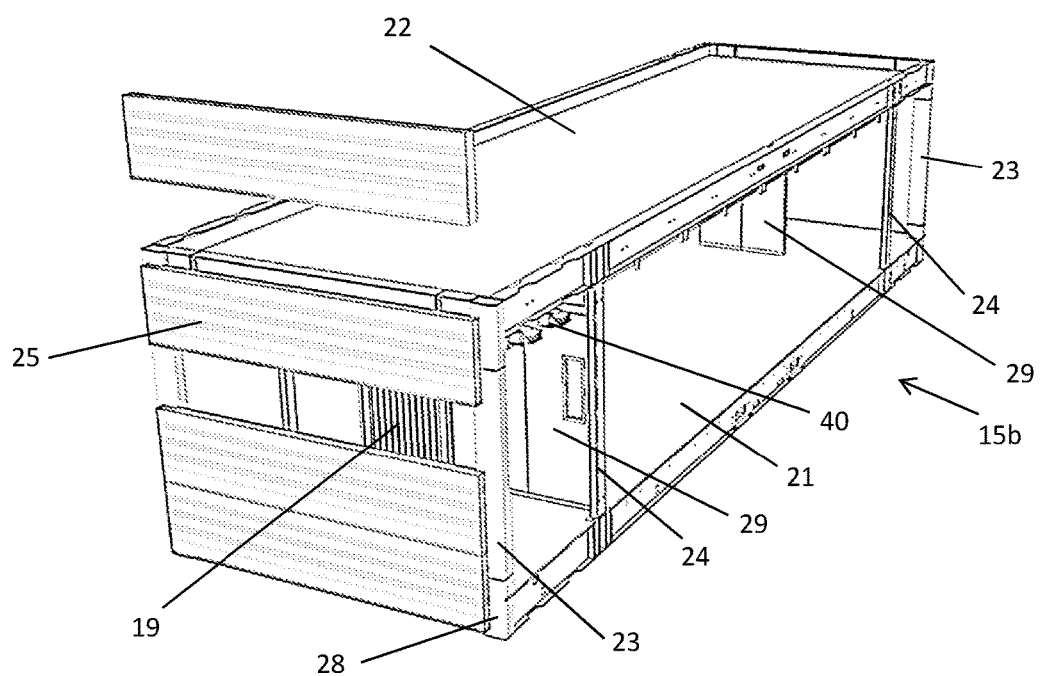
FIG. 14 shows a perspective view of a partially assembled section of the data centre of FIG. 1.

Once this basic section structure has been assembled, the internal wall panels 29 are fixed into place as shown by FIG. 14. The vented door 19 and outstation is installed at this stage, as are the busbar sections which connect the cold corridor busbars to the busbars in the hot and cold aisles. Then the external wall panels 25 are fixed to either end of the section and, where necessary, the external doors and/or louvres are fitted. This can be done simultaneously with the internal walls being installed. These are the only steps involved in the assembly of an IT section.

For an air optimiser section 15a, 15h, the following additional steps are required. External wall panels 25 are fitted on one of the long sides of the section. Internal walls and doors are fitted to enclose the air treatment region 16. Power management zone panels (which include the control process panel 31 and electrical distribution panels 32) are fitted to the inside surfaces of the space behind the air treatment region 16. The air optimisation module 136 equipment is installed in the air treatment region 16.

Figure 15A:
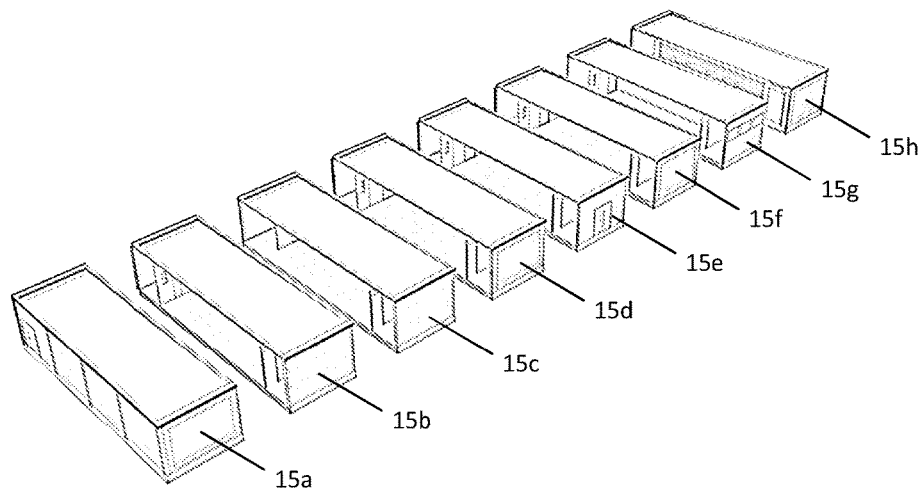
FIG. 15a shows a perspective view of all of the sections of the data centre of FIG. 1.
Figure 15B:
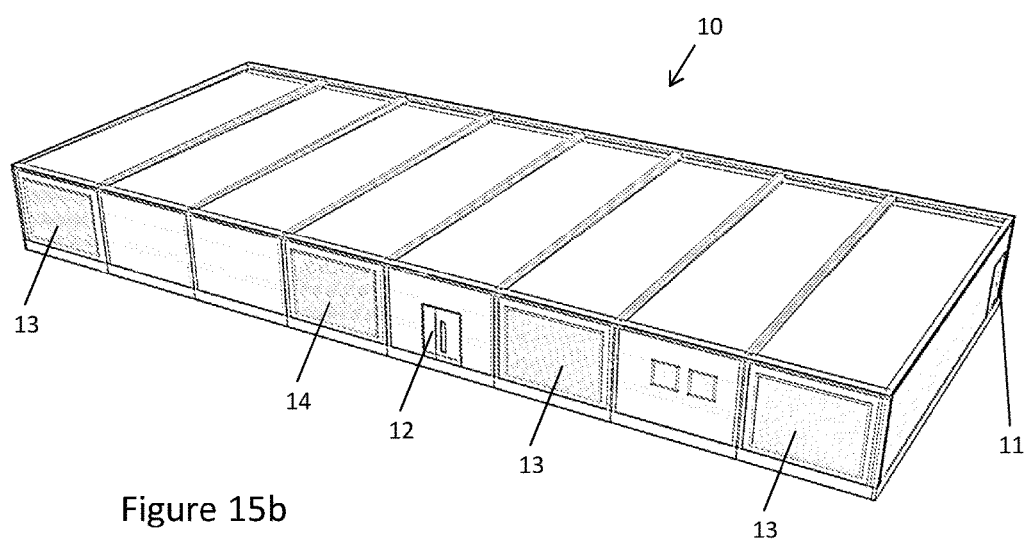
FIG. 15b shows a perspective view of the data centre of FIG. 1.

The assembled sections 15 can be moved around using the crane or combi-lifter. In this manner the sections are arranged adjacent each other as shown in FIGS. 15a and 15b. The left-hand air optimiser section 15a is placed in position first. Then IT section 15b is positioned and fixed next to section 15a. The remaining sections 15c-h are positioned and fixed together, including connecting the hot corridor service cassettes 60 and cold corridor service cassettes 40 in adjacent sections, to form the complete data centre building 10.

By this stage, most of the mechanical and electrical apparatus is already installed in the building by virtue of the service cassettes. The remaining mechanical and electrical fitout tasks include installing a pair of fire suppression gas cylinders in the hot corridor of each section and connecting these to the fire suppression gas pipe on the ceiling of the hot aisle in that section, installing the control process panel 31 and the electrical distribution panels 32 into section 15a, running network cables around the building to connect the control process panel 31 to the various sensors, louvres, outstations and air treatment equipment which it monitors and/or controls, and connecting the busbars to the electrical distribution panels. It will be appreciated that these tasks are rendered fairly minor because the distribution of power, cables, lighting, sensors and fire suppression gas pipework throughout the IT sections of the data centre 10 has already been taken care of by the service cassettes.

At this stage the data centre is ready for the racks to be installed and for it to be connected up to the local utility supplies, which is a simple matter of making a connection at a single point. The data centre building can then be commissioned and populated with IT equipment. Using the method described above, the entire manufacture and construction process from order to completion can take less than six weeks.

Figure 16A:
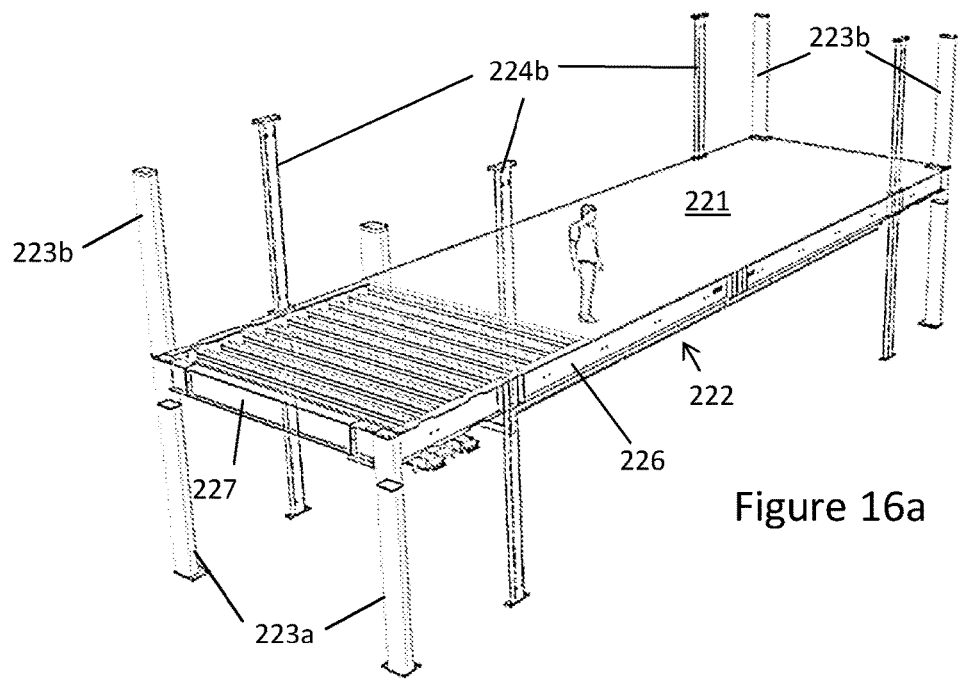
FIG. 16a shows a perspective view of part of a two storey data centre according to a second embodiment.
Figure 16B:
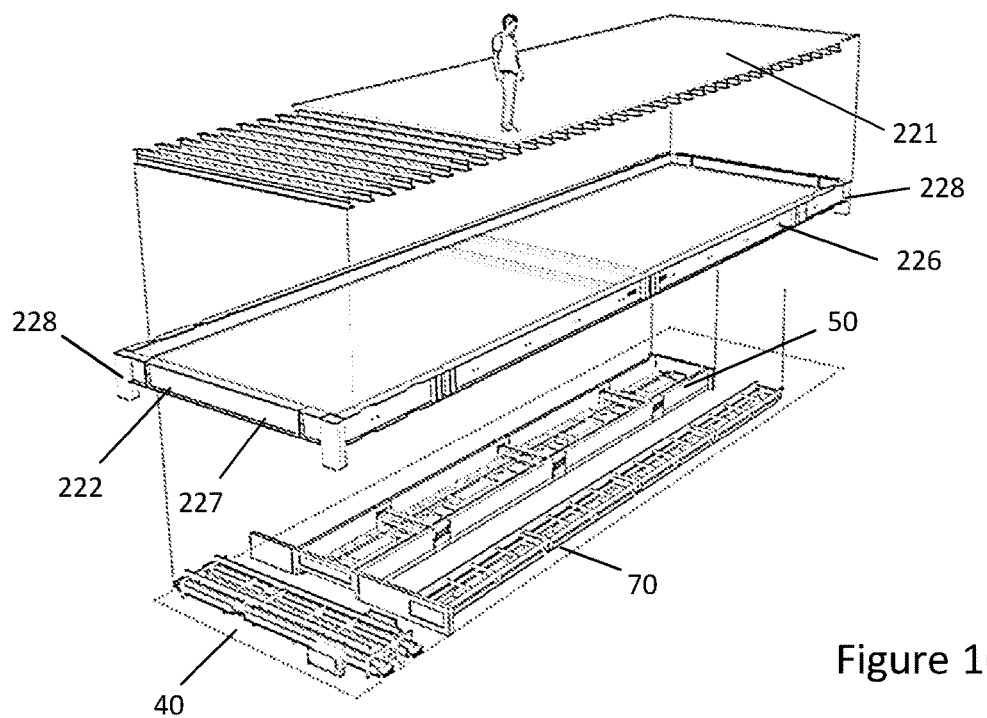

FIGS. 16a, 16b and 17 show a data centre building 210 according to a second embodiment of the invention. FIG. 16b is an exploded view of the main parts shown in FIG. 16a. In contrast to the first embodiment, the data centre building of the second embodiment is a multi-storey data centre. The interior layout and operation of each storey of the data centre 210 is very similar to the single-storey data centre of the first embodiment, and for example each level comprises two air optimiser sections, and six IT sections. There are however differences between the first and second embodiments which are described below.

In this second embodiment the ceiling portions 222 of the ground floor storey also serve as the floor portions 221 of the sections immediately above. This does not require any alteration to the basic structure of the ceiling portion; rather it is simply a matter of fixing flooring material to the top of the ceiling section 222 rather than roofing material. Thus, as shown in FIGS. 16a and 16b, the ceiling portion 222 comprises a framework consisting of two long side steel beams 226, two short end steel beams 227, and four steel corner elements 228, which are designed to connect with the ground floor corner posts 223a (shown in FIG. 16a) which support the ceiling portion 222. The lower surface (not visible) of the ceiling portion 222 is made from steel plate with a plastic coating finish.

On top of the ceiling portion 222, the floor 221 is defined by means of a plywood floor deck supported on the joists of ceiling portion 222.

In this second embodiment, the corner elements 228 also support the corner posts 223b of the first floor. Similarly, intermediate support posts 224b for the first floor extend upwardly from the ceiling portion 222.

As best shown in the exploded view of FIG. 16b, a cold corridor service cassette 40, a cold aisle service cassette 50, a hot aisle service cassette 70, and a bulkhead 91 are mounted on the lower surface of the ceiling portion 222.

FIG. 17 shows (on the right hand side) a cut-away perspective view of the two-storey data centre 210 once installed in a larger building. In this embodiment, the floor 300 of the building accommodating the data centre 210 provides the floor of the ground-level storey of the data centre 210. It will be appreciated that the larger building may, as a result of housing a data centre, itself be considered as a data centre or a data centre building, despite possibly performing other functions. In the case where a larger building is used to house the data centre, there may be less of a requirement for water-proofing of the top storey of the data centre 210. It may for example be provided without additional roofing elements. The uppermost ceiling portions 222 of the data centre 210 of FIG. 17 are not for example provided with any roof linings or sloped roof panels for draining rain water. As shown schematically on the left hand side of FIG. 17, the uppermost ceiling portion 222b comprises a steel structure 294 onto the underside of which are mounted the service cassettes (labelled collectively as item 299). The ceiling portion 222a between the ground and first floors, also shown schematically on the left hand side of FIG. 17, similarly comprises a steel structure 294 onto the underside of which are mounted the service cassettes 299, but also has floor covering (collectively represented by numeral 295) mounted on top of the joists.

Whilst not shown in FIG. 17, an external metal staircase is fixed to the outside of the modules to provide access to the upper level of the data centre.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The data centre building 10 of the first embodiment is designed to be installed on an outside site. The present invention may equally well be used for a data centre (single or multi-storey) which is to be located inside an existing building, for example a warehouse. In this case the roof portions do not need to be covered with roofing material, and there is no need to provide floor portions at all. Instead corner elements 28 can be provided separately for fixing to the floor as supports for the corner columns.

Packages 131 require a base board onto which the section components can be secured since there are no floor portions. This results in the packages being considerably lighter and slightly smaller in volume. When assembling the data centre building, each section must be constructed in its final position since the sections do not form complete volumetric units that can be moved around after being assembled.

The data centre components which are centrally manufactured or locally sourced may be different from the lists set out above. It will be appreciated that any division is possible, and indeed all of the components may be sourced locally or manufactured centrally. If all of the data centre components are manufactured centrally then the sections 15 will be packed into packages 111, 112, and the DX units will be packed into DX modules 131, in the central factory and will be sent straight to the final site.

The bulkheads 91 mentioned above could instead be provided as steel structure incorporated in the ceiling portions 22.

The data centre building could be constructed as a multi-storey data centre building, having more than two storeys.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A data centre, wherein the data centre comprises a plurality of hot aisles interleaved with and aligned lengthwise parallel to a plurality of cold aisles, the data centre utilising an above-floor cooling regime in which cooling air is provided via a personnel corridor, wherein the data centre comprises a plurality of structural sections assembled together and aligned lengthwise parallel to the plurality of cold aisles and the plurality of hot aisles to define a unitary structure containing said personnel corridor in at least one personnel area that spans at least two sections, the at least one personnel area being selected from the list consisting of a cold aisle, a hot aisle and an air supply corridor; wherein the plurality of structural sections comprise:
 a first section for accommodating a plurality of server racks and having a ceiling,
  wherein at least two different services are mounted on the ceiling, and
 a second section for accommodating a plurality of server racks and having a ceiling,
  wherein at least two different services are mounted on the ceiling, wherein the at least two different services of the first section are integrated with the at least two different services of the second section,
 and wherein over-rack blanking panels are provided to prevent cold air passing between tops of the server racks and the ceiling of each section.

2. A data centre according to claim 1, wherein the plurality of structural sections are each assembled from kits of parts which can be transported in a sum volume smaller than the sum volume of the corresponding plurality of structural sections once so assembled.

3. A data centre according to claim 2, wherein each section has a volume of between 20 m$^3$ and 200 m$^3$ once so assembled.

4. A data centre according to claim 1, wherein the at least two different services of the first section are integrated with the at least two different services of the second section by means of a junction formed by one or more separate junction connectors that link the services at one end of the first section with the corresponding services at one end of the adjacent second section.

5. A data centre according to claim 1, wherein each section is associated with a service-carrying chassis mounted to the ceiling portion, the service-carrying chassis comprising a frame onto which is mounted the components of the different services.

6. A data centre according to claim 1, wherein said at least two different services of the first section connected to said two different services of the second section comprise at least three different types of services of the group of services consisting of:
   primary electrical power,
   backup electrical power,
   data transfer services,
   lighting, and
   a conduit for transporting a fluid.

7. A data centre according to claim 6, wherein of said group of services:
   the service providing primary electrical power, if present, is in the form of a busbar,
   the service providing backup electrical power is in the form of a busbar,
   the service providing data transfer services, if present, is in the form of at least one of a cable tray and a plurality of network cables,
   the service providing lighting, if present, comprises at least one of a powered light and a occupancy sensor, and
   the service providing the conduit for transporting a fluid, if present, is in the form of a fire suppressant gas supply pipe.

8. A data centre according to claim 1, wherein no walls or floors of the data centre are used in the provision of the at least two services to areas of the data centre accommodating racks of IT equipment.

9. A data centre according to claim 1, wherein the first section and the second section have a fully open face on their adjacent sides.

10. A data centre according to claim 1, wherein the above floor cooling regime provides cooling air to the cold aisles via a personnel corridor.

11. A data centre according to claim 1, wherein the ceiling of the first section and the ceiling of the second section are mounted on a plurality of vertical support posts.

* * * * *